United States Patent
Duan et al.

(10) Patent No.: US 9,716,608 B2
(45) Date of Patent: Jul. 25, 2017

(54) MULTI-ELEMENT CODE MODULATION MAPPING METHOD, DEVICE AND COMPUTER STORAGE MEDIUM

(71) Applicant: ZTE Corporation, Shenzhen, Guangdong (CN)

(72) Inventors: Can Duan, Shenzhen (CN); Jun Xu, Shenzhen (CN); Jin Xu, Shenzhen (CN); Guanghui Yu, Shenzhen (CN); Ningning Tong, Shenzhen (CN); Danfeng Zhao, Shenzhen (CN); Xiangchao Zhou, Shenzhen (CN)

(73) Assignee: ZTE Corporation, Guangdong (CN)

( * ) Notice: Subject to any disclaimer, the term of this patent is extended or adjusted under 35 U.S.C. 154(b) by 0 days.

(21) Appl. No.: 15/121,200

(22) PCT Filed: Jul. 30, 2014

(86) PCT No.: PCT/CN2014/083320
§ 371 (c)(1),
(2) Date: Aug. 24, 2016

(87) PCT Pub. No.: WO2015/127757
PCT Pub. Date: Sep. 3, 2015

(65) Prior Publication Data
US 2017/0019289 A1    Jan. 19, 2017

(30) Foreign Application Priority Data
Feb. 26, 2014   (CN) .......................... 2014 1 0067438

(51) Int. Cl.
*H04L 27/36* (2006.01)
*H03M 13/11* (2006.01)
(Continued)

(52) U.S. Cl.
CPC ......... *H04L 27/36* (2013.01); *H03M 13/1157* (2013.01); *H03M 13/255* (2013.01);
(Continued)

(58) Field of Classification Search
CPC ... H04L 1/0066; H04L 1/0071; H04L 1/1893; H04L 27/3405
See application file for complete search history.

(56) References Cited

U.S. PATENT DOCUMENTS

| 8,798,200 | B2 | 8/2014 | Xu | |
| 2008/0225965 | A1* | 9/2008 | Pi | H04L 1/0003 375/260 |

(Continued)

FOREIGN PATENT DOCUMENTS

| CN | 101282122 A | 10/2008 |
| CN | 101753256 A | 6/2010 |

(Continued)

OTHER PUBLICATIONS

International Search Report in international application No. PCT/CN2014/083320, mailed on Dec. 3, 2014, 5 pgs.
(Continued)

*Primary Examiner* — Ross Varndell
(74) *Attorney, Agent, or Firm* — Cooper Legal Group, LLC

(57) ABSTRACT

Disclosed is a multi-element code modulation mapping method and device, relating to communications and designed to improve communication reliability. The method includes that: multi-element domain coding is performed on a first sequence including K multi-element codes to obtain a second sequence including N multi-element codes; $K_1$ and $K_2$ are calculated according to a multi-element domain element number q and a modulation order M, wherein $K_1 * \log_2 q = K_2 * \log_2 M$, both $K_1$ and $K_2$ are integers not
(Continued)

smaller than 2, and both q and M are power of 2; the second sequence is divided into z groups of multi-element codes with each group including $K_1$ multi-element codes, wherein C=formula (I), and formula (II) represents rounding up; each group of multi-element codes is mapped to a constellation diagram to form $K_2$ Mth-order modulation symbols; and z groups of Mth-order modulation symbols are sequentially cascaded to form a modulation symbol to be sent. The present disclosure further discloses a computer storage medium.

19 Claims, 5 Drawing Sheets

(51) Int. Cl.
  *H03M 13/25* (2006.01)
  *H04L 1/00* (2006.01)
  *H04L 1/18* (2006.01)
  *H04L 27/34* (2006.01)
(52) U.S. Cl.
  CPC ........ *H03M 13/1171* (2013.01); *H04L 1/0066* (2013.01); *H04L 1/0071* (2013.01); *H04L 1/1893* (2013.01); *H04L 27/3405* (2013.01)

(56) References Cited

U.S. PATENT DOCUMENTS

| | | | |
|---|---|---|---|
| 2010/0284444 A1* | 11/2010 | Lakkis | H04B 1/707 375/150 |
| 2012/0020435 A1 | 1/2012 | Xu | |

FOREIGN PATENT DOCUMENTS

| | | |
|---|---|---|
| CN | 101867441 A | 10/2010 |
| CN | 103236902 A | 8/2013 |
| CN | 103595685 A | 2/2014 |

OTHER PUBLICATIONS

English Translation of the Written Opinion of the International Search Authority in international application No. PCT/CN2014/083320, mailed on Dec. 3, 2014, 11 pgs.
Supplementary European Search Report in European application No. 14884066.3, mailed on Feb. 14, 2017, 13 pgs.
"Uplink Cooperative Detection for Non-binary Coded Wireless Network", Haitao Li and Haiying Yuan, Aug. 2011, Proc. 2011 IEEE/ACM International Conference on Green Computing and Communications (Greencom), pp. 96-99.
"The stability of LDPC codes over GF(q) with higher order modulation schemes", V.S.Ganepola, R.A. Carrasco, I.J. Wassell and S. Le-Goff, Sep. 2010, Proc. 2010 7th International Symposium on Wireless Communication Systems (ISWCS), IEEE, Piscataway, NJ, USA, pp. 586-590.
"Getting Closer to MIMO Capacity with Non-Binary Codes and Spatial Multiplexing", Stephan Pfletschinger and David Declercq, Dec. 2010, Proc. 2010 IEEE Global Telecommunications Conference (GL0BEC0M 2010), IEEE, Piscataway, NJ, USA, pp. 1-5.
"Digital Video Broadcasting (DVB); Frame structure channel coding and modulation for a second generation digital terrestrial television broadcasting system (DVB-T2)", Apr. 1, 2012, Retrieved from the Internet: URL:http://www.etsi.org/deliver/etsi_en/302700_302799/302755/01.03.01_60/en 302755v010301p.pdf, 188 pgs.

* cited by examiner

MULTI-ELEMENT CODE MODULATION MAPPING METHOD, DEVICE AND COMPUTER STORAGE MEDIUM

TECHNICAL FIELD

The present disclosure relates to a modulation technology in the field of communications, and in particular to a multi-element code modulation mapping method and device and a computer storage medium.

BACKGROUND

In signal modulation and demodulation, a relationship between signals is usually represented directly by means of a constellation diagram. For example, a code element containing communication information is mapped to a constellation point in the constellation diagram in the modulation process, and a received signal is judged in the constellation diagram to acquire the communication information or the like in the demodulation process.

A constellation diagram has the following characteristics:

(1). Bits of different constellation points on the constellation diagram for modulation mapping have different reliability. For example, if bit x of constellation point A is the same as all or most of bits x of constellation points around constellation point A, bit x of constellation point A in decoding has a low error probability, i.e. high reliability; otherwise, reliability is low.

(2). When each of the constellation points includes more bits, different bits also correspond to different reliability. For example, a constellation point in a 64 Quadrature Amplitude Modulation (QAM) constellation diagram includes 6 bits, and reliability of the 6 bits may sequentially be "high, high, medium, medium, low and low."

Therefore, if modulation symbols formed during multi-element code mapping are all mapped to low-reliability positions of constellation points, a poor anti-interference capability may be incurred due to low reliability. In addition, smaller errors in a transmission process may result in decoding errors. Meanwhile, there will be the problem of high error rate, which further results in low communication performance.

In addition, it is common to combine a multi-element error correcting code and high-order modulation in a conventional communication system to increase a data transmission rate and improve a sudden error resisting capability in a fading channel. However, modulation symbols formed by code element mapping may be unlikely to be recovered during decoding on a receiving side if there is deep attenuation for modulation symbols, namely when signals are seriously attenuated, in the transmission process, which may cause a high information transmission error rate and performance loss.

From the above, it is a problem urgent to be solved in a conventional art to provide a modulation mapping method capable of solving low reliability caused by deep attenuation and the characteristic of reliability unbalance of constellation points.

SUMMARY

In view of this, the embodiments of the present disclosure are intended to provide a multi-element code modulation mapping method and device and a computer storage medium, so as to solve the problem of low reliability caused by the characteristic of reliability unbalance of constellation points in a constellation diagram and deep attenuation.

To this end, the technical solutions of the embodiments of the present disclosure are implemented as follows.

In a first aspect, the embodiments of the present disclosure provide a modulation mapping method, which includes that:

multi-element domain coding is performed on a first sequence including K multi-element codes to obtain a second sequence including N multi-element codes;

$K_1$ and $K_2$ are calculated according to a multi-element domain element number q and a modulation order M, wherein $K_1 * \log_2 q = K_2 * \log_2 M$, $K_1$ and $K_2$ may both be integers not smaller than 2, and q and M may both be power of 2;

the second sequence is divided into z groups of multi-element codes with each group including $K_1$ multi-element codes, wherein $z=\lceil N/K_1 \rceil$, and $\lceil\ \rceil$ may represent rounding up;

each group of multi-element codes is mapped to a constellation diagram to form $K_2$ Mth-order modulation symbols, wherein each group of multi-element codes may be mapped to at least two Mth-order modulation symbols; and z groups of Mth-order modulation symbols are sequentially cascaded to form a modulation symbol to be sent.

Preferably, $\log_2 M = m$ and $\log_2 q = p$; a least common multiple of m and p may be Y; n may be a positive integer;

if $m=n*p$, $K_1=2*m/p$;

if $p=n*m$, $K_1=2$; and if m is unequal to $n*p$ and p is unequal to $n*m$, $K_1=Y/p$.

Preferably, the step that the second sequence is divided into the z groups of multi-element codes with each group including $K_1$ multi-element codes may include that:

$\lceil N/K_1 \rceil * K_1 - N$ zero code words are added to the second sequence to form a third sequence including $N_1$ multi-element codes, wherein $N_1=\lceil N/K_1 \rceil * K_1$; and the third sequence is grouped to obtain the z groups of multi-element codes with each group including $K_1$ multi-element codes.

Preferably, the step that the third sequence is grouped to obtain the z groups of multi-element codes with each group including $K_1$ multi-element codes may be implemented as follows:

the third sequence is sequentially grouped backwards from a starting position of the third sequence according to formula $C_{i,j}=B_{i \cdot K_1 + j}$ by taking continuous $K_1$ multi-element codes as a group, wherein $C_{i,j}$ may be a $j^{th}$ multi-element code in an $i^{th}$ group; $B_{i \cdot K_1 + j}$ may be an $(i \cdot K_1 + j)^{th}$ multi-element code in the third sequence;

i may be 0 or a positive integer smaller than z; and j may be 0 or a positive integer smaller than $K_1$.

Preferably, the step that each group of multi-element codes is mapped to the constellation diagram may be implemented as follows:

each group of multi-element codes is mapped to the constellation diagram by adopting a direct total mapping, In-phase/Quadrature (I/Q) path mapping or interleaving mapping method.

Preferably, the step that each group of multi-element codes is mapped to the constellation diagram by adopting the direct total mapping method may include that:

when $K_1 = \log_2 M$, a $k^{th}$ bit in a binary bit sequence corresponding to each multi-element code in the $i^{th}$ group of multi-element codes $C_{i,0}, C_{i,1}, \ldots, C_{i,K_1-1}$ is extracted to form a $k^{th}$ Mth-order complex modulation symbol $S_{i,k}$ for mapping according to formula $(S_{i,k}^{m-1}, \ldots, S_{i,k}^{0})=(c_{i,0}^{k}, c_{i,1}^{k}, \ldots, c_{i,K_1-1}^{k})$, and $S_{i,k}$ is mapped to the constellation diagram, wherein $(S_{i,k}^{m-1}, \ldots, S_{i,k}^{0})$ may be a binary bit sequence corresponding to the modulation symbol $S_{i,k}$; $m=\log_2 M$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$; $p=\log_2 q$; $c_{i,j}^{k}$ may represent the $k^{th}$ bit of the binary bit sequence corresponding to the $j^{th}$ multi-element code in the $i^{th}$ group;

i may be 0 or a positive integer smaller than z;

j may be 0 or a positive integer smaller than $K_1$; and k may be 0 or a positive integer smaller than $K_2$.

Preferably, the step that each group of multi-element codes is mapped to the constellation diagram by adopting the I/Q path mapping method may include that:

when $K_1=(\log_2 M)/2$, the $k^{th}$ bit in the binary bit sequence corresponding to each multi-element code in the $i^{th}$ group of multi-element codes $C_{i,0}, C_{i,1}, \ldots, C_{i,K_1-1}$ is extracted to form a real part or imaginary part of the Mth-order modulation symbol $S_{i,k}$ according to formula $(S_{i,k}^{I,m/2-1}, \ldots, S_{i,k}^{I,0})=(c_{i,0}^{k}, c_{i,1}^{k}, \ldots, c_{i,K_1-1}^{k})$ and formula $(S_{i,k}^{Q,m/2-1}, \ldots, S_{i,k}^{Q,0})=(c_{i,0}^{k+p/2}, c_{i,1}^{k+p/2}, \ldots c_{i,K_1-1}^{k+p/2})$, wherein $(S_{i,k}^{I,m/2-1}, \ldots, S_{i,k}^{I,0})$ may be the real part $S_{i,k}^{I}$ of $S_{i,k}$; $(S_{i,k}^{Q,m/2-1}, \ldots, S_{i,k}^{Q,0})$ may be the real part $S_{i,k}^{Q}$ of $S_{i,k}$; $m=\log_2 M$; $p=\log_2 q$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$; $p=\log_2 q$; $c_{i,j}^{k}$ may represent the $k^{th}$ bit of the binary bit sequence corresponding to the $j^{th}$ multi-element code in the $i^{th}$ group;

i may be 0 or a positive integer smaller than z;

j may be 0 or a positive integer smaller than $K_1$; and k may be 0 or a positive integer smaller than $K_2$.

Preferably, the step that each group of multi-element codes is mapped to the constellation diagram by adopting the I/Q path mapping method may include that:

when $K_1=2$ and $p=\log_2 q=n*(\log_2 M)/2$, continuous m/2 bits in the binary bit sequence corresponding to each multi-element code in the $i^{th}$ group of multi-element codes $C_{i,0}, C_{i,1}, \ldots, C_{i,K_1-1}$ are extracted to form the real part or imaginary part of the Mth-order modulation symbol $S_{i,k}$ according to formula $(S_{i,k}^{I,m/2-1}, \ldots, S_{i,k}^{I,0})=(c_{i,0}^{mk/2}, c_{i,0}^{mk/2+1}, \ldots, c_{i,0}^{m(k+1)/2-1})$ and formula $(S_{i,k}^{Q,m/2-1}, \ldots, S_{i,k}^{Q,0})=(c_{i,1}^{mk/2}, c_{i,1}^{mk/2+1}, \ldots, c_{i,1}^{m(k+1)/2-1})$, wherein $(S_{i,k}^{I,m/2-1}, \ldots, S_{i,k}^{I,0})$ may be the real part of $S_{i,k}$; $(S_{i,k}^{Q,m/2-1}, \ldots, S_{i,k}^{Q,0})$ may be the imaginary part $S_{i,k}^{Q}$ of $S_{i,k}$; $m=\log_2 M$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$; $p=\log_2 q$; $c_{i,j}^{k}$ may represent the $k^{th}$ bit of the binary bit sequence corresponding to the $j^{th}$ multi-element code in the $i^{th}$ group;

i may be 0 or a positive integer smaller than z;

j may be 0 or a positive integer smaller than $K_1$; and k may be 0 or a positive integer smaller than $K_2$.

Preferably, the step that each group of multi-element codes is mapped to the constellation diagram by adopting the interleaving mapping method may include that:

when $K_1=\log_2 M$, a binary bit sequence $e_{i,0}, e_{i,1}, \ldots, e_{i,pK_1-1}$ obtained after cyclic interleaving of a binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$ is obtained according to formulae $r=((t \bmod p)*(m+1)+\lfloor t/m \rfloor) \bmod m + (t \bmod p)*m$ and $d_{i,t}=e_{i,r}$; and a binary bit sequence $(S_{i,k}^{m/2-1}, \ldots, S_{i,k}^{0})$ corresponding to the Mth-order modulation symbol $S_{i,k}$ is acquired according to formula $(S_{i,k}^{m-1}, \ldots, S_{i,k}^{0})=(e_{i,km}, e_{i,km+1}, \ldots, e_{i,(k+1)m-1})$, and $S_{i,k}$ is sequentially mapped to the constellation diagram, wherein $m=\log_2 M$; $p=\log_2 q$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$;

$d_{i,t}$ may be a $t^{th}$ bit of the binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$, and t may be an index number, and may be valued to be 0 or a positive integer smaller than $pK_1$;

$e_{i,r}$ may be a $r^{th}$ bit of the binary bit sequence $e_{i,0}, e_{i,1}, \ldots, e_{i,pK_1-1}$ output after cyclic interleaving of the binary bit sequence of the $i^{th}$ group, and r may be an index number, and may be valued to be 0 or a positive integer smaller than $pK_1$; and k may be 0 or a positive integer smaller than $K_2$.

In a second aspect, the embodiments of the present disclosure provide a modulation mapping device, which includes:

a multi-element domain coding unit, configured to perform multi-element domain coding on a first sequence including K multi-element codes to obtain a second sequence including N multi-element codes;

a calculation unit, configured to calculate $K_1$ and $K_2$ according to a multi-element domain element number q and a modulation order M, wherein $K_1*\log_2 q=K_2*\log_2 M$, $K_1$ and $K_2$ may both be integers not smaller than 2, and q and M may both be power of 2;

a grouping unit, configured to divide the second sequence into z groups of multi-element codes with each group including $K_1$ multi-element codes, wherein $z=\lceil N/K_1 \rceil$, and $\lceil \ \rceil$ may represent rounding up;

a mapping unit, configured to map each group of multi-element codes to a constellation diagram to form $K_2$ Mth-order modulation symbols, wherein each group of multi-element codes may be mapped to at least two Mth-order modulation symbols; and a cascading unit, configured to sequentially cascade z groups of Mth-order modulation symbols to form a modulation symbol to be sent.

Preferably, $\log_2 M=m$ and $\log_2 q=p$; a least common multiple of m and p may be Y; n may be a positive integer;

if $m=n*p$, $K_1=2*m/p$;

if $p=n*m$, $K_1=2$; and if m is unequal to $n*p$ and p is unequal to $n*m$, $K_1=Y/p$.

Preferably, the grouping unit may include:

an addition module, configured to add $\lceil N/K_1 \rceil*K_1-N$ zero code words to the second sequence to form a third sequence including $N_1$ multi-element codes, wherein $N_1=\lceil N/K_1 \rceil*K_1$; and a group forming module, configured to group the third sequence to obtain the z groups of multi-element codes with each group including $K_1$ multi-element codes.

Preferably, the group forming module may be configured to sequentially group the third sequence backwards from a starting position of the third sequence according to formula $C_{i,j}=B_{i \cdot K_1+j}$ by taking continuous $K_1$ multi-element codes as a group;

$C_{i,j}$ may be a $j^{th}$ multi-element code in an $i^{th}$ group; and $B_{i \cdot K_1+j}$ may be an $(i \cdot K_1+j)^{th}$ multi-element code in the third sequence, wherein i may be 0 or a positive integer smaller than z; and j may be 0 or a positive integer smaller than $K_1$.

Preferably, the mapping unit may be configured to map each group of multi-element codes to the constellation diagram by adopting a direct total mapping, I/Q path mapping or interleaving mapping method.

Preferably, the mapping unit may include:

a first mapping module, configured to, when $K_1 = \log_2 M$, extract a $k^{th}$ bit in binary bit sequence corresponding to each multi-element code in the $i^{th}$ group of multi-element codes $C_{i,0}, C_{i,1}, \ldots, C_{i,K_1-1}$ to form a $k^{th}$ Mth-order complex modulation symbol $S_{i,k}$ for mapping according to formula $(S_{i,k}^{m-1}, \ldots, S_{i,k}^{0}) = (c_{i,0}^{k}, c_{i,1}^{k}, \ldots, c_{i,K_1-1}^{k})$, and map $S_{i,k}$ to the constellation diagram, wherein $(S_{i,k}^{m-1}, \ldots, S_{i,k}^{0})$ may be a binary bit sequence corresponding to $S_{i,k}$; $m = \log_2 M$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$; $p = \log_2 q$; $c_{i,j}^{k}$ may represent the $k^{th}$ bit of the binary bit sequence corresponding to the $j^{th}$ multi-element code in the $i^{th}$ group;

i may be 0 or a positive integer smaller than z;

j may be 0 or a positive integer smaller than $K_1$; and k may be 0 or a positive integer smaller than $K_2$.

Preferably, the mapping unit may include:

a second mapping module, configured to, when $K_1 = (\log_2 M)/2$, extract the $k^{th}$ bit in the binary bit sequence corresponding to each multi-element code in the $i^{th}$ group of multi-element codes $C_{i,0}, C_{i,1}, \ldots, C_{i,K_1-1}$ to form a real part or imaginary part of the Mth-order modulation symbol $S_{i,k}$ according to formula $(S_{i,k}^{I,m/2-1}, \ldots, S_{i,k}^{I,0}) = (c_{i,0}^{k}, c_{i,1}^{k}, \ldots, c_{i,K_1-1}^{k})$ and formula $(S_{i,k}^{Q,m/2-1}, \ldots, S_{i,k}^{Q,0}) = (c_{i,0}^{k+p/2}, c_{i,1}^{k+p/2}, \ldots, c_{i,K_1-1}^{k+p/2})$, wherein $(S_{i,k}^{I,m/2-1}, \ldots, S_{i,k}^{I,0})$ may be the real part $S_{i,k}^{I}$ of $S_{i,k}$; $(S_{i,k}^{Q,m/2-1}, \ldots, S_{i,k}^{Q,0})$ may be the real part $S_{i,k}^{Q}$ of $S_{i,k}$; $m = \log_2 M$; $p = \log_2 q$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$; $p = \log_2 q$; $c_{i,j}^{k}$ may represent the $k^{th}$ bit of the binary bit sequence corresponding to the $j^{th}$ multi-element code in the $i^{th}$ group;

i may be 0 or a positive integer smaller than z;

j may be 0 or a positive integer smaller than $K_1$; and k may be 0 or a positive integer smaller than $K_2$.

Preferably, the mapping unit may include:

a third mapping module, configured to, when $K_1 = 2$ and $p = \log_2 q = n*(\log_2 M)/2$, extract continuous m/2 bits in the binary bit sequence corresponding to each multi-element code in the $i^{th}$ group of multi-element codes $C_{i,0}, C_{i,1}, \ldots, C_{i,K_1-1}$ to form the real part or imaginary part of the Mth-order modulation symbol $S_{i,k}$ according to formula $(S_{i,k}^{I,m/2-1}, \ldots, S_{i,k}^{I,0}) = (c_{i,0}^{mk/2}, c_{i,0}^{mk/2+1}, \ldots, c_{i,0}^{m(k+1)/2-1})$ and formula $(S_{i,k}^{Q,m/2-1}, \ldots, S_{i,k}^{Q,0}) = (c_{i,1}^{mk/2}, c_{i,1}^{mk/2+1}, \ldots, c_{i,1}^{m(k+1)/2-1})$, wherein $(S_{i,k}^{I,m/2-1}, \ldots, S_{i,k}^{I,0})$ may be the real part of $S_{i,k}$; $(S_{i,k}^{Q,m/2-1}, \ldots, S_{i,k}^{Q,0})$ may be the imaginary part $S_{i,k}^{Q}$ of $S_{i,k}$; $m = \log_2 M$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$; $p = \log_2 q$; $c_{i,j}^{k}$ may represent the $k^{th}$ bit of the binary bit sequence corresponding to the $j^{th}$ multi-element code in the $i^{th}$ group;

i may be 0 or a positive integer smaller than z;

j may be 0 or a positive integer smaller than $K_1$; and k may be 0 or a positive integer smaller than $K_2$.

Preferably, the mapping unit may include:

an interleaving module, configured to, when $K_1 = \log_2 M$, obtain a binary bit sequence $e_{i,0}, e_{i,1}, \ldots, e_{i,pK_1-1}$ obtained after cyclic interleaving of a binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$ according to formulae $r = ((t \bmod p)*(m+1) + \lfloor t/m \rfloor) \bmod m + (t \bmod p)*m$ and $d_{i,t} = e_{i,r}$; and a fourth mapping module, configured to acquire a binary bit sequence $(S_{i,k}^{m/2-1}, \ldots, S_{i,k}^{0})$ corresponding to the Mth-order modulation symbol $S_{i,k}$ according to formula $(S_{i,k}^{m-1}, \ldots, S_{i,k}^{0}) = (e_{i,km}, e_{i,km+1}, \ldots, e_{i,(k+1)m-1})$, and sequentially map $S_{i,k}$ to the constellation diagram, wherein $m = \log_2 M$; $p = \log_2 q$;

the binary bit sequence corresponding to the $j^{th}$ multi-element code $C_{i,j}$ in the $i^{th}$ group may be $c_{i,j}^{0}, c_{i,j}^{1}, \ldots, c_{i,j}^{p-1}$;

$d_{i,t}$ may be a $t^{th}$ bit of the binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$, and t may be an index number, and may be valued to be 0 or a positive integer smaller than $pK_1$;

$e_{i,r}$ may be a $r^{th}$ bit of the binary bit sequence $e_{i,0}, e_{i,1}, \ldots, e_{i,pK_1-1}$ output after cyclic interleaving of the binary bit sequence of the $i^{th}$ group, and r may be an index number, and may be valued to be 0 or a positive integer smaller than $pK_1$; and k may be 0 or a positive integer smaller than $K_2$.

In a third aspect, the embodiments of the present disclosure further provide a computer storage medium having computer-executable instructions configured to execute at least one of the methods according to the first aspect of the embodiments of the present disclosure.

According to the multi-element code modulation mapping method and device and computer storage medium in the embodiments of the present disclosure, the same multi-element code is mapped to at least two Mth-order modulation symbols. Each of the modulation symbols passes through different paths of a multipath fading channel to obtain a diversity gain of the fading channel of the multi-element code in a transmission process. The same multi-element code is further mapped to bits, with different reliability, of different constellation points in a constellation diagram, so as to obtain a diversity gain of the constellation diagram, thereby improving transmission reliability and facilitating improvement in communication quality.

DETAILED DESCRIPTION

Preferable embodiments of the present disclosure will be described below with reference to the drawings in detail, and it should be understood that the preferable embodiments described below are only intended to describe and explain the present disclosure and not intended to limit the present disclosure.

Embodiment 1

Figure 1:
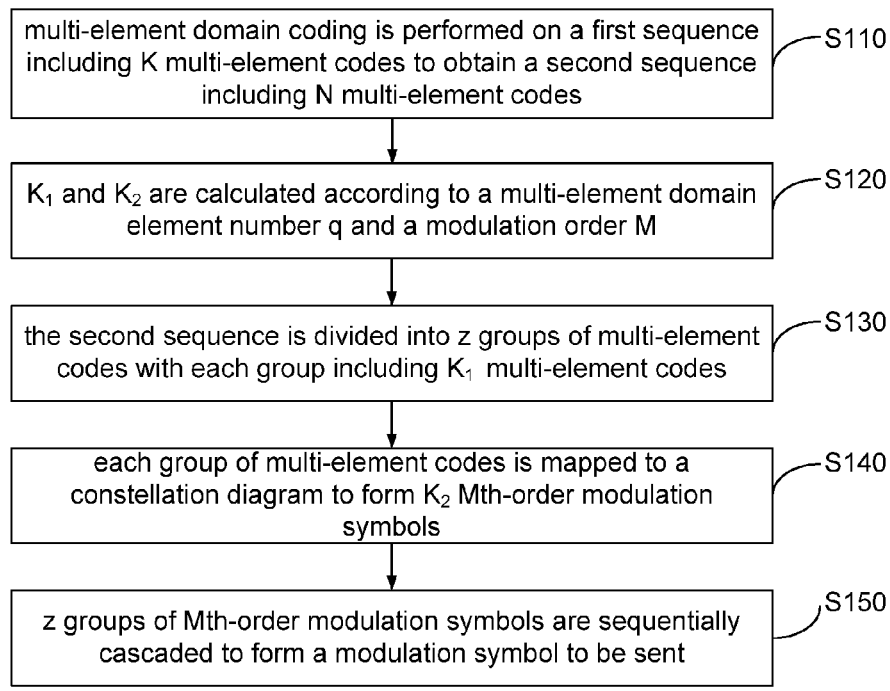
FIG. 1 is a flowchart showing a multi-element code modulation mapping method according to embodiment 1 of the present disclosure.

As shown in FIG. 1, the embodiment provides a multi-element code modulation mapping method, which includes the following steps.

Step 110: multi-element domain coding is performed on a first sequence including K multi-element codes to obtain a second sequence including N multi-element codes, wherein N=K/u, K is an integer not smaller than 1, and u is a code rate, and is valued to be a positive number not more than 1;

Step 120: $K_1$ and $K_2$ are calculated according to a multi-element domain element number q and a modulation order M, wherein $K_1 * \log_2 q = K_2 * \log_2 M$, both $K_1$ and $K_2$ are integers not smaller than 2, both q and M are power of 2, and the multi-element domain element number is the total number of multi-element codes in a multi-element domain;

Step 130: the second sequence is divided into z groups of multi-element codes with each group including $K_1$ multi-element codes, wherein $z=\lceil N/K_1 \rceil$, and $\lceil \ \rceil$ represents rounding up;

Step 140: each group of multi-element codes is mapped to a constellation diagram to form $K_2$ Mth-order modulation symbols, wherein each group of multi-element codes is mapped to at least two Mth-order modulation symbols; and Step 150: z groups of Mth-order modulation symbols are sequentially cascaded to form a modulation symbol to be sent.

In Step 110, a specific value of K may be any positive integer such as 2, 3, 4 and 5; and one multi-element code corresponds to an element in the first sequence. For example, if the first sequence includes 3 multi-element codes, and ½ multi-element domain coding is performed, a second sequence including 6 multi-element codes is formed.

In Step 120, $K_1$ is a first sub-group parameter, and $K_2$ is a second sub-group parameter. The power may be recorded as $2^o$, wherein o is 0 or a positive integer. A ratio of $K_1$ and $K_2$ is at least determined according to formula $K_1 * \log_2 q = K_2 * \log_2 M$. There are many methods for determining specific values of $K_1$ and $K_2$. For example, during specific implementation, one of $K_1$ and $K_2$ may be directly assigned, and the other is naturally determined. In the embodiment, a specific implementation mode is further provided, specifically as follows:

$\log_2 M = m$ and $\log_2 q = p$; a least common multiple of m and p is Y; n is a positive integer;

if $m=n*p$, $K_1 = 2*m/p$;

if $p=n*m$, $K_1 = 2$; and if m is unequal to $n*p$ and p is unequal to $n*m$, $K_1 = Y/p$.

According to the definitions about m and p, $K_1 * \log_2 q = K_2 * \log_2 M$ may further be represented as formula $K_2 = K_1 * p/m$.

During division of group in Step 130, each group includes $K_1$ multi-element codes from the second sequence. When being equal to 3.12, $N/K_1$ is rounded up to obtain a value 4 of c. In a specific implementation process, when $N/K_1$ is not an integer, the number of multi-element codes in the last group may be not equal to the number of multi-element codes in a group which is not the last group. In this case, there are many methods to make the number of multi-element codes in each group of multi-element codes be same. For example, zero code elements may be added, specifically as follows:

the step that the second sequence is divided into the z groups of multi-element codes with each group including $K_1$ multi-element codes includes that:

$\lceil N/K_1 \rceil * K_1 - N$ zero code words are added to the second sequence to form a third sequence including $N_1$ multi-element codes, wherein $N_1 = \lceil N/K_1 \rceil * K_1$; and the third sequence is divided into the z groups of multi-element codes with each group including $K_1$ multi-element codes.

wherein the step that the third sequence is divided into the z groups of multi-element codes with each group including $K_1$ multi-element codes is implemented as follows:

continuous $K_1$ multi-element codes from a starting position of the third sequence are taken as a group and so on; and the first multi-element code is taken as the starting position for sequential grouping, and each next group of multi-element codes follows the last multi-element code of the previous group of multi-element codes to the end.

Continuous $K_1$ multi-element codes from a starting position of the third sequence are taken as a group according to formula $C_{i,j} = B_{i \cdot K_1 + j}$ and so on, wherein $C_{i,j}$ is a $j^{th}$ multi-element code in an $i^{th}$ group; and $B_{i \cdot K_1 + j}$ is an $(i \cdot K_1 + j)^{th}$ multi-element code in the third sequence, wherein i is 0 or a positive integer smaller than z; and j is 0 or a positive integer smaller than $K_1$.

In a specific implementation process, the zero code elements may further be directly added to the last group to make the numbers of the multi-element codes in all groups equal.

There are many methods for mapping the multi-element codes to the constellation diagram in Step 140. For example, the multi-element codes are mapped to the constellation diagram by adopting a direct total mapping, I/Q path mapping or interleaving mapping method.

The step that each group of multi-element codes is mapped to the constellation diagram by adopting the direct total mapping method includes that:

when $K_1 = \log_2 M$, $k^{th}$ bit in binary bit sequence corresponding to each multi-element code in the $i^{th}$ group of multi-element codes $C_{i,0}, C_{i,1}, \ldots, C_{i,K_1-1}$ is extracted to form a $k^{th}$ Mth-order complex modulation symbol $S_{i,k}$ for mapping according to formula $(S_{i,k}^{m-1}, \ldots, S_{i,k}^0) = (c_{i,0}^k, c_{i,1}^k, \ldots, c_{i,K_1-1}^k)$, and $S_{i,k}$ is mapped to the constellation diagram, wherein $(S_{i,k}^{m-1}, \ldots, S_{i,k}^0)$ is a binary bit sequence corresponding to the $S_{i,k}$; $m = \log_2 M$;

i is 0 or a positive integer smaller than z;

the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p = \log_2 q$; $c_{i,j}^k$ represents the $k^{th}$ bit of the binary bit sequence corresponding to the $j^{th}$ multi-element code in the $i^{th}$ group;

i is 0 or a positive integer smaller than z;

j is 0 or a positive integer smaller than $K_1$; and k is 0 or a positive integer smaller than $K_2$.

The step that each group of multi-element codes is mapped to the constellation diagram by adopting the direct total mapping method may specifically include the following steps:

first, each multi-element code in each group of multi-element codes is converted into a binary bit sequence or the binary bit sequence corresponding to each multi-element code in each group of multi-element codes is directly acquired according to a mapping table; and when $K_1=\log_2 M$, the $k^{th}$ bit in the binary bit sequence corresponding to each multi-element code in a group is sequentially extracted to form the $k^{th}$ Mth-order complex modulation symbol for mapping, and is mapped to the constellation diagram, wherein k is a natural number not more than $K_2$, and k may be a number equal to or smaller than $K_2$, such as 0, 1 or 2.

When the I/Q path mapping method is adopted, there are two manners.

Manner 1: the step that each group of multi-element codes is mapped to the constellation diagram by adopting the I/Q path mapping method includes that:

when $K_1=(\log_2 M)/2$, the $k^{th}$ bit in the binary bit sequence corresponding to each multi-element code in the $i^{th}$ group of multi-element codes $C_{i,0}, C_{i,1}, \ldots, C_{i,K_1-1}$ is extracted to form a real part or imaginary part of the Mth-order modulation symbol $S_{i,k}$ according to formula $(S_{i,k}^{I,m/2-1}, \ldots, S_{i,k}^{I,0})=(c_{i,0}^k, c_{i,1}^k, \ldots, c_{i,K_1-1}^k)$ and formula $(S_{i,k}^{Q,m/2-1}, \ldots, S_{i,k}^{Q,0})=(c_{i,0}^{k+p/2}, c_{i,1}^{k+p/2}, \ldots c_{i,K_1-1}^{k+p/2})$, that is, the $k^{th}$ bits in the binary bit sequences corresponding to multi-element codes in a group are sequentially extracted to form the real part of the Mth-order modulation symbol, and $(k+p/2)^{th}$ bits in the binary bit sequences corresponding to multi-element codes in the group are sequentially extracted to form the imaginary part of the Mth-order modulation symbol, wherein $(S_{i,k}^{I,m/2-1}, \ldots, S_{i,k}^{I,0})$ is the real part $S_{i,k}^I$ of $S_{i,k}$; $(S_{i,k}^{Q,m/2-1}, \ldots, S_{i,k}^{Q,0})$ is the imaginary part $S_{i,k}^Q$ of $S_{i,k}$; $m=\log_2 M$; $p=\log_2 q$;

the binary bit sequence corresponding to the jth multi-element code $C_{i,j}$ in the ith group is $c_{i,j}^0, c_{i,j}^1, \ldots, c_{i,j}^{p-1}$; $p=\log_2 q$; $c_{i,j}^k$ represents the kth bit of the binary bit sequence corresponding to the jth multi-element code in the ith group;

i is 0 or a positive integer smaller than z;

j is 0 or a positive integer smaller than $K_1$; and k is 0 or a positive integer smaller than $K_2$.

The step that each group of multi-element codes is mapped to the constellation diagram in the first I/Q path mapping manner may specifically include the following steps.

Firstly, each multi-element code in each group of multi-element codes is converted into a binary bit sequence or the binary bit sequence corresponding to each multi-element code in each group of multi-element codes is directly acquired according to the mapping table;

secondly, when $K_1=(\log_2 M)/2$ is met, bits at the same positions of the binary bit sequences corresponding to respective multi-element codes are sequentially mapped to the real parts of the Mth-order modulation symbols, thereby implementing mapping of first half part of the binary bit sequence corresponding to each multi-element code; and finally, bits at the same positions of latter half parts of the binary bit sequences corresponding to respective multi-element codes are sequentially mapped to the imaginary parts of the Mth-order modulation symbols, thereby implementing mapping of the latter half part of the binary bit sequence corresponding to each multi-element code. As such, the total mapping is completed.

In the first I/Q path mapping method, for each Mth-order modulation symbol, the bits at the same positions of the real part and the imaginary part are from the same multi-element code word. For example, when 16QAM is adopted, M=16, and then each symbol includes 4 bits, wherein each real part includes 2 bits, each imaginary part includes 2 bits, and the 0th bits of the real and imaginary parts are both from the 0th multi-element code.

Manner 2: the step that each group of multi-element codes is mapped to the constellation diagram by adopting the I/Q path mapping method includes that:

when $K_1=2$ and $p=\log_2 q=n*(\log_2 M)/2$, continuous m/2 bits in the binary bit sequence corresponding to each multi-element code in the ith group of multi-element codes $C_{i,0}, C_{i,1}, \ldots, C_{i,K_1-1}$ are extracted to form the real part or imaginary part of the Mth-order modulation symbol $S_{i,k}$ according to formula $(S_{i,k}^{I,m/2-1}, \ldots, S_{i,k}^{I,0})=(c_{i,0}^{mk/2}, c_{i,0}^{mk/2+1}, \ldots, c_{i,0}^{m(k+1)/2-1})$ and formula $(S_{i,k}^{Q,m/2-1}, \ldots, S_{i,k}^{Q,0})=(c_{i,1}^{mk/2}, c_{i,1}^{mk/2+1}, \ldots c_{i,1}^{m(k+1)/2-1})$, wherein $(S_{i,k}^{I,m/2-1}, \ldots, S_{i,k}^{I,0})$ is the real part of $S_{i,k}$; $(S_{i,k}^{Q,m/2-1}, \ldots, S_{i,k}^{Q,0})$ is the imaginary part $S_{i,k}^Q$ of $S_{i,k}$; $m=\log_2 M$;

the binary bit sequence corresponding to the jth multi-element code $C_{i,j}$ in the ith group is $c_{i,j}^0, c_{i,j}^1, \ldots, c_{i,j}^{p-1}$; $p=\log_2 q$; $c_{i,j}^k$ represents the kth bit of the binary bit sequence corresponding to the jth multi-element code in the ith group;

i is 0 or a positive integer smaller than z;

j is 0 or a positive integer smaller than $K_1$; and k is 0 or a positive integer smaller than $K_2$.

The step that each group of multi-element codes is mapped to the constellation diagram in the second I/Q path mapping manner may specifically include the following steps.

Firstly, each multi-element code in each group of multi-element codes is converted into a binary bit sequence or the binary bit sequence corresponding to each multi-element code in each group of multi-element codes is directly acquired according to the mapping table;

secondly, when $K_1=2$ and $p=\log_2 q=n*(\log_2 M)/2$ are met, the binary bit sequence corresponding to the 0th multi-element codes is sequentially divided into n groups with each group including $(\log_2 M)/2$ bits, and the bits of each group are sequentially mapped to the real parts of the $K_2$ Mth-order modulation symbols to finish mapping the binary bit sequence corresponding to the 0th multi-element codes; and thirdly, the binary bit sequence corresponding to the first multi-element codes is sequentially divided into n groups with each group including $(\log_2 M)/2$ bits, and the bits of each group are sequentially mapped to the imaginary parts of the $K_2$ Mth-order modulation symbols to finish mapping the binary bit sequences corresponding to the first multi-element codes. As such, the complete mapping is finished.

In the second I/Q path mapping method, $K_1=2$ is limited. That is, each group includes only two multi-element codes, each part of the 0th code word is mapped to the real parts of the $K_2$ Mth-order modulation symbols, and each part of the first code word is mapped to the imaginary parts of the $K_2$ Mth-order modulation symbols. For example, if 16QAM is adopted, M=16, and then each symbol includes 4 bits, wherein the real part includes 2 bits, the imaginary part includes 2 bits, the 2 bits of the real part are from the 0th multi-element code and the 2 bits of the imaginary part are from the first multi-element code.

The step that the multi-element codes are mapped to the constellation diagram by adopting the interleaving mapping method includes that:

when $K_1 = \log_2 M$, a binary bit sequence $e_{i,0}, e_{i,1}, \ldots, e_{i,pK_1-1}$ obtained after cyclic interleaving of a binary bit sequence $d_{i,0}, d_{i,1}, \ldots, d_{i,pK_1-1}$ corresponding to the ith group of multi-element codes $C_{i,0}, C_{i,1}, \ldots, C_{i,K_1-1}$ is obtained according to formulae $r = ((t \bmod p)*(m+1) + \lfloor t/m \rfloor) \bmod m + (t \bmod p)*m$ and $d_{i,t} = e_{i,r}$; and a binary bit sequence $(S_{i,k}^{m/2-1}, \ldots, S_{i,k}^{0})$ corresponding to the Mth-order modulation symbol $S_{i,k}$ is acquired according to formula $(S_{i,k}^{m-1}, \ldots, S_{i,k}^{0}) = (e_{i,km}, e_{i,km+1}, \ldots, e_{i,(k+1)m-1})$, and $S_{i,k}$ is sequentially mapped to the constellation diagram, wherein $m = \log_2 M$; $p = \log_2 q$;

the binary bit sequence corresponding to the jth multi-element code $C_{i,j}$ in the ith group is $c_{i,j}^{0}, c_{i,j}^{1}, \ldots, c_{i,j}^{p-1}$; $p = \log_2 q$;

$d_{i,t}$ is the $t^{th}$ bit of the binary bit sequence $d_{i,0}, d_{i,1}, \ldots, d_{i,pK_1-1}$ corresponding to the ith group of multi-element codes $C_{i,0}, C_{i,1}, \ldots, C_{i,K_1-1}$, and t is an index number, and is valued to be 0 or a positive integer smaller than $pK_1$;

$e_{i,r}$ is the $r^{th}$ bit of the binary bit sequence $e_{i,0}, e_{i,1}, \ldots, e_{i,pK_1-1}$ output after cyclic interleaving of the binary bit sequence of the $i^{th}$ group, and r is an index number, and is valued to be 0 or a positive integer smaller than $pK_1$; and k is 0 or a positive integer smaller than $K_2$.

The step that the multi-element codes are mapped to the constellation diagram by adopting the interleaving mapping method may be implemented by the following steps.

Firstly, each multi-element code in each group of multi-element codes is converted into a binary bit sequence, wherein a binary bit is 0 or 1 and the binary bit sequence is a sequence consisting of 0 and 1;

secondly, cyclic shift interleaving is performed on the binary bit sequences of each group of multi-element codes to obtain a matrix of cyclically interleaved binary bit sequences according to q and M; and thirdly, the cyclically interleaved binary bit sequences are sequentially mapped to the constellation diagram with each row or column as an Mth-order modulation symbol.

Herein, the step that cyclic shift interleaving is performed on the binary bit sequences of each group of multi-element codes to obtain the matrix of cyclically interleaved binary bit sequences according to q and M may be implemented by:

converting each multi-element code in each group of multi-element codes into a binary bit sequence. For example, if a multi-element code is 4, then a binary bit sequence corresponding to the multi-element code 4 is 100. Further, if p is 8 at this moment, binary bits 0 may be directly added before 100 to form a binary bit sequence 00000100 including 8 bits.

Binary bit sequences respectively corresponding to a group of multi-element codes are sequentially arranged into a binary bit sequence, and the binary bit sequence is input into a p*m matrix, wherein $m = \log_2 M$ and $p = \log_2 q$; and cyclic shift is performed on each column in the matrix by different numbers of bits, and then a cyclically interleaved binary bit sequence is output by column.

The constellation diagram may be a constellation diagram corresponding to a modulation method such as Quadrature Phase Shift Keying (QPSK), Multiple Quadrature Amplitude Modulation (MQAM), Multiple Phase Shift Keying (MPSK) or Multiple Amplitude Phase Shift Keying (MAPSK), wherein the MAPSK is also called a star-like QAM.

According to the multi-element code modulation mapping method of the embodiment, a binary bit sequence corresponding to the same code element corresponds to multiple Mth-order modulation symbols, so that a diversity gain of a fading channel may be obtained. Moreover, the multiple Mth-order modulation symbols are mapped to bits, with different reliability, of different constellation points, so that instability of the constellation points in the constellation diagram is relieved.

The multi-element code modulation mapping method of the embodiment may be applied to any communication node, specifically such as a macro evolved Node B, a micro evolved Node B, a home evolved Node B, a relay station, a radio frequency connector, a terminal or a mobile communication device.

Some specific examples will be provided below based on the multi-element code modulation mapping method of the embodiment.

Example 1

Figure 2:
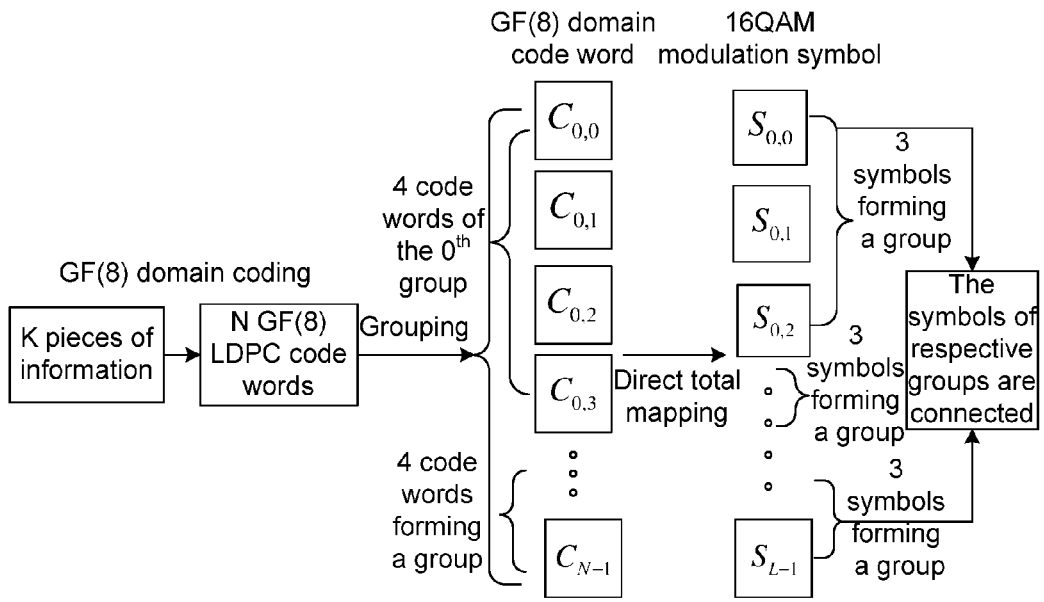
FIG. 2 is schematic diagram 1 showing a multi-element code modulation mapping method according to example 1.
Figure 3:
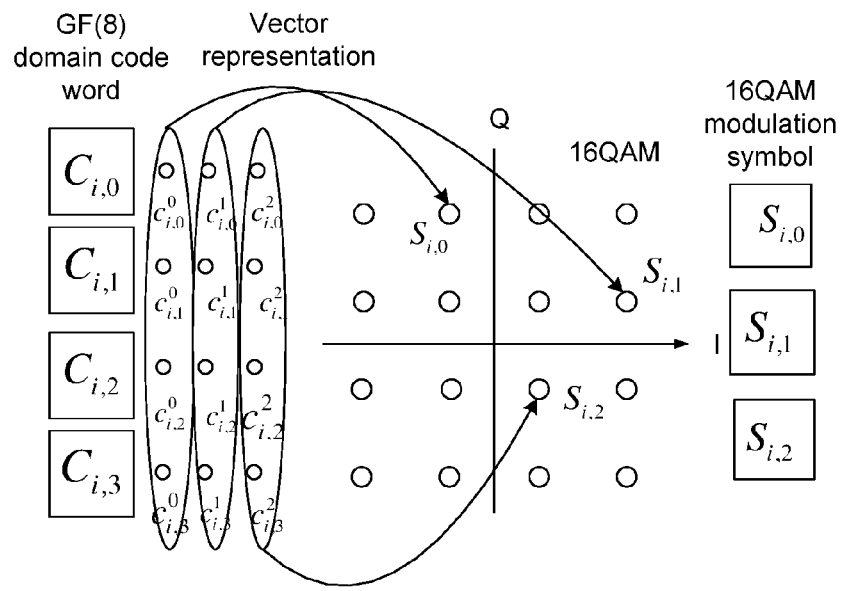
FIG. 3 is schematic diagram 2 showing a multi-element code modulation mapping method according to example 1.

The example is an application example of a direct total mapping-based multi-element code modulation mapping method. As shown in FIG. 2 and FIG. 3, a first sequence is $A_0, A_1, \ldots, A_{K-1}$ including K multi-element codes, wherein $A_I$ represents one multi-element code; and I is a natural number smaller than K. The natural number includes zero and positive integers. GF(8) Low-Density Parity-Check (LDPC) coding is performed on the first sequence to obtain a second sequence $B_0, B_1, \ldots, B_{N-1}$ including N multi-element codes, wherein a value of N is determined by K and a code rate of multi-element domain coding.

It is set that $\alpha$ is a primitive element on Galois Field GF(q) (q>2), $\alpha^\infty = 0$, and each power of $\alpha$, $\alpha^0 = 1, \alpha, \ldots, \alpha^{q-2}$ form all domain elements on a GF(q) domain and these domain elements form a cyclic group. Each power of $\alpha$ may be converted into a ($p = \log_2 q$)th-order polynomial of $\alpha$ by primitive polynomial transformation, p coefficients of the polynomial of $\alpha$ are extracted and sequentially arranged to form a pth-dimensional vector, and the vector may be associated with a multi-element code including p binary code elements. Element 0 may be represented by a pth-dimensional all-zero binary code. In such a manner, a GF(4) domain multi-element code may be represented as a 2-bit vector, a GF(16) domain multi-element code may be represented as a 4-bit vector, a GF(64) domain multi-element code may be represented as a 6-bit vector, and so on, wherein each element corresponds to a multi-element code.

If it is necessary to perform 16QAM mapping on the multi-element code sequence, then q=8, and M=16. $K_1=3$ and $K_2=4$ are calculated according to formula (1) and formula (2), wherein formula (1) is:

$$K_1 = \begin{cases} 2*m/p & \text{condition 1: if } m = n*p, \\ & \text{wherein } n \text{ is a positive integer more than 1;} \\ & \text{condition 2: if } p = n*m, \\ 2 & \text{wherein } n \text{ is a positive integer more than or} \\ & \text{equal to 1;} \\ (\text{least common multiple of } m \text{ and } p)/p & \text{if both condition 1 and 2 are not met.} \end{cases}$$

and formula (2) is: $K_2 = K_1 * p/m$.

$\lceil N/K_1 \rceil * K_1 - N$ zero code words are added after the second sequence, and then the added sequence with a length of $N_1 = \lceil N/K_1 \rceil * K_1$ is divided into totally $z = \lceil N/K_1 \rceil$ group of multi-element codes with each group including 4 multi-element codes.

A binary bit sequence $(c_{i,j}^0 c_{i,j}^1 c_{i,j}^2)$ corresponding to a $j^{th}$ GF(8) domain multi-element code $C_{i,j}$ in 4 coded GF(8) domain multi-element codes $[C_{i,0} C_{i,1} C_{i,2} C_{i,3}]$ of the $i^{th}$ group is modulated to form totally $K_2 = 3$ 16QAM symbols $S_{i,0} S_{i,1} S_{i,2}$, wherein the $i^{th}$ group is any group in the z group of multi-element codes; $c_{i,j}^0$ is a $0^{th}$ bit of the binary bit sequence corresponding to the multi-element code $C_{i,j}$; $c_{i,j}^1$ is a first bit in the binary bit sequence corresponding to the multi-element code $C_{i,j}$; and $c_{i,j}^2$ is a second bit of the binary bit sequence corresponding to the multi-element code $C_{i,j}$.

When $K_1 = \log_2 M$, a direct total mapping method is adopted, kth bits in binary bit sequences corresponding to each multi-element code in an input group of $K_1$ GF(q) domain multi-element codes are totally mapped to form a group of $K_1$ bits for mapping to a constellation diagram to form a $k^{th}$ Mth-order complex modulation symbol.

A binary bit sequence $(S_{i,k}^{m-1}, \ldots, S_{i,k}^0)$ corresponding to the kth modulation symbol $S_{i,k}$ is obtained according to the following formula:

$$(S_{i,k}^{m-1}, \ldots S_{i,k}^0) = (c_{i,k}^k, c_{i,1}^k, \ldots, c_{i,K_1-1}^k).$$

By the direct total mapping method, a group of 4 bits $(c_{i,0}^0 c_{i,1}^0 c_{i,2}^0 c_{i,3}^0)$ formed by 0th bit of the binary bit sequence corresponding to each multi-element code in the $i^{th}$ group is mapped to a $0^{th}$ 16QAM symbol $S_{i,0}$ of the $i^{th}$ group, i.e. a binary bit sequence $(S_{i,0}^3, S_{i,0}^2, s_{i,0}^1, S_{i,0}^0) = c_{i,0}^0 c_{i,1}^0 c_{i,2}^0 c_{i,3}^0$ corresponding to $S_{i,0}$.

A group of 4 bits $(c_{i,0}^1 c_{i,1}^1 c_{i,2}^1 c_{i,3}^1)$ formed by first bit of the binary bit sequences corresponding to each multi-element code in the $i^{th}$ group is mapped to a first 16QAM symbol $S_{i,1}$ of the $i^{th}$ group, i.e. a binary bit sequence $(S_{i,1}^3, S_{i,1}^2, s_{i,1}^1, S_{i,1}^0) = c_{i,0}^1 c_{i,1}^1 c_{i,2}^1 c_{i,3}^1$ corresponding to $S_{i,1}$.

A group of 4 bits $(c_{i,0}^2 c_{i,1}^2 c_{i,2}^2 c_{i,3}^2)$ formed by second bits of the binary bit sequences corresponding to each multi-element code in the $i^{th}$ group are mapped to a second 16QAM symbol $S_{i,2}$ of the $i^{th}$ group, i.e. a binary bit sequence $(S_{i,2}^3, S_{i,2}^2, s_{i,2}^1, S_{i,2}^0) = c_{i,0}^2 c_{i,1}^2 c_{i,2}^2 c_{i,3}^2$ corresponding to $S_{i,2}$.

By the direct total mapping method, the bits are mapped to the 3 16QAM symbols $(S_{i,0} S_{i,1} S_{i,2})$.

The modulation symbols corresponding to each group of multi-element codes are sequentially cascaded.

When being transmitted through a multipath Rayleigh fading channel, symbol $S_{i,0}$ passes through path $H_0$, symbol $S_{i,1}$ passes through path $H_1$ and symbol $S_{i,2}$ passes through path $H_2$. Signals received on a receiving side are $H_0^*(c_{i,0}^0 c_{i,1}^0 c_{i,2}^0 c_{i,3}^0) + n_0$, $H_1^*(c_{i,0}^1 c_{i,1}^1 c_{i,2}^1 c_{i,3}^1) + n_1$ and $H_2^*(c_{i,0}^2 c_{i,1}^2 c_{i,2}^2 c_{i,3}^2) + n_2$, respectively. Soft information of the first multi-element code obtained before decoding comes from $H_0^* c_{i,0}^0$, $H_1^* c_{i,0}^1$ and $H_2^* c_{i,0}^2$, and soft information of each next multi-element code is all from the three paths $H_0$, $H_1$ and $H_2$. If a part of bits corresponding to the multi-element codes is subject to deep attenuation in a certain path and has poorer performance, but other bits are gently attenuated and have higher performance in the other paths, overall performance of whole multi-element code transmission may be prevented from being greatly influenced according to associations between different bits during multi-element domain decoding at a receiver, and a capability of a multi-element code in resisting the fading channel is improved, so that the method of the example obtains a fading diversity gain by means of the characteristics of the multi-element codes.

In the example, a value of k is ranged from 0 to a positive integer smaller than $K_2$; and a value of j is ranged from 0 to a positive integer smaller than p, wherein $p = \log_2 q$.

Example 2

The example is a specific application example based on a first I/Q path mapping method.

Figure 4:
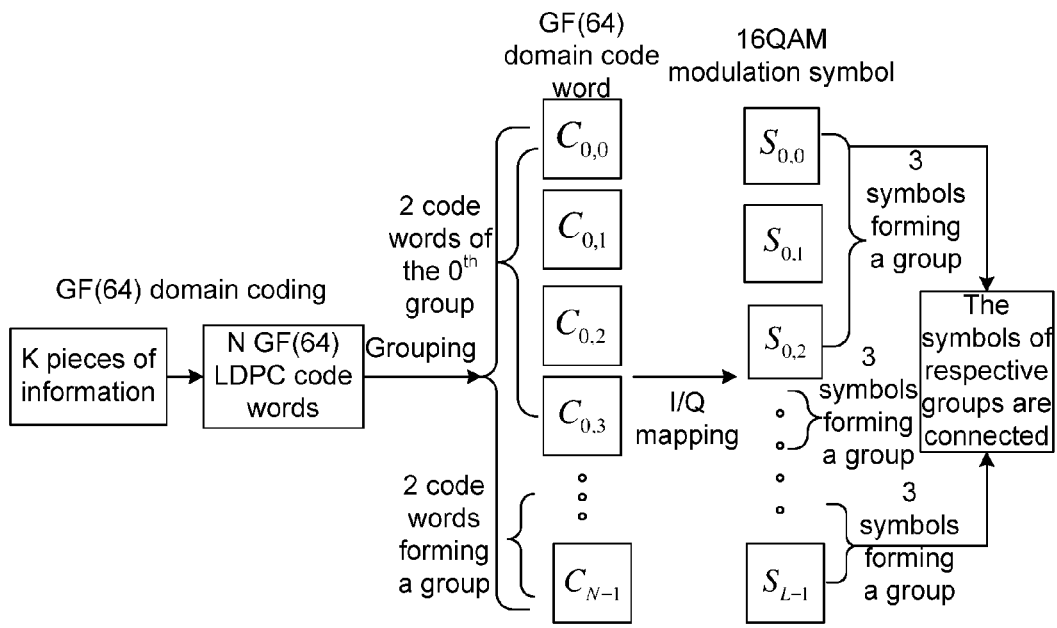
FIG. 4 is schematic diagram 1 showing a multi-element code modulation mapping method according to example 2.
Figure 5:
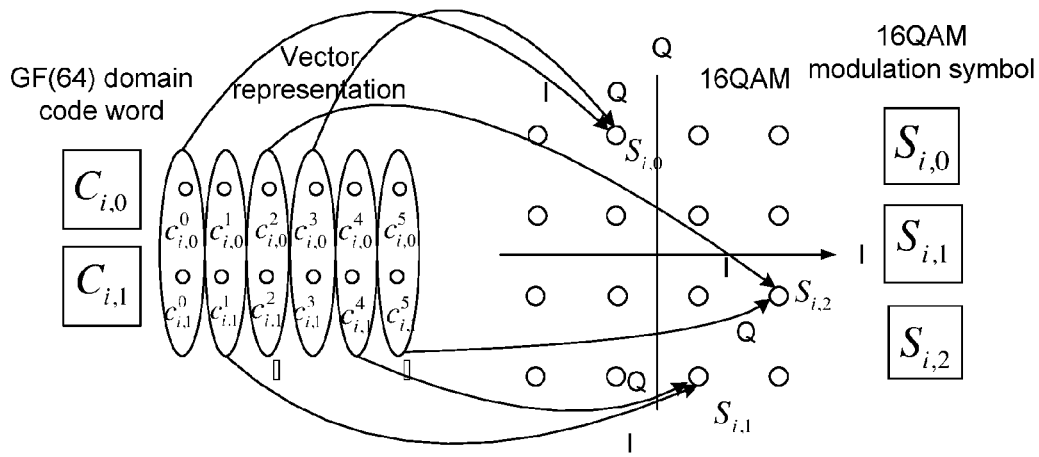
FIG. 5 is schematic diagram 2 showing a multi-element code modulation mapping method according to example 2.

As shown in FIG. 4 and FIG. 5, firstly, GF(64) LDPC coding is performed on a first sequence $A_0, A_1, \ldots, A_{K-1}$ including K multi-element codes to obtain a second sequence $B_0, B_1, \ldots, B_{N-1}$ including N multi-element codes.

Secondly, if it is necessary to perform 16QAM mapping on the multi-element code sequence, then q=64 and M=16. $K_1 = 2$ and $K_2 = 3$ are calculated according to formula (1) and formula (2), wherein formula (1) is:

$$K_1 = \begin{cases} 2*m/p & \text{condition 1: if } m = n*p, \\ & \text{wherein } n \text{ is a positive integer more than 1;} \\ 2 & \text{condition 2: if } p = n*m, \\ & \text{wherein } n \text{ is a positive integer more than or} \\ & \text{equal to 1;} \\ (\text{least common multiple of } m \text{ and } p)/p & \text{if both condition 1 and 2 are not met.} \end{cases}$$

and formula (2) is: $K_2 = K_1 * p/m$.

Thirdly: $\lceil N/K_1 \rceil * K_1 - N$ zero code words are added after the second sequence including the N multi-element codes, and then the added sequence with a length of $N_1 = \lceil N/K_1 \rceil * K_1$ is divided into groups with each group including 2 multi-element codes.

Fourthly: a binary bit sequence $(c_{i,j}^0 c_{i,j}^1 c_{i,j}^2 c_{i,j}^3 c_{i,j}^4 c_{i,j}^5)$ corresponding to a $j^{th}$ GF(64) domain multi-element code $C_{i,j}$ in 2 coded GF(64) domain multi-element codes $[C_{i,0} C_{i,1}]$ of an $i^{th}$ group is modulated to form totally 3 16QAM symbols $S_{i,0} S_{i,1} S_{i,2}$.

When $K_1 = (\log_2 M)/2$, if a modulation node adopts an I/Q path mapping method, a group of $K_1$ bits formed by bits at the same positions in binary bit sequences corresponding to respective multi-element codes in an input group of $K_1$ GF(q) domain multi-element codes is modulated into a real part (I path) or imaginary part (Q path) of a complex modulation symbol, and the $K_1$ GF(q) domain multi-element codes are modulated into $K_2$ Mth-order modulation symbols, wherein the Mth-order modulation symbols are complex modulation symbols. A $k^{th}$ complex modulation symbol $S_{i,k}$ corresponds to $(s_{i,k}^{I,m/2-1}, \ldots, s_{i,k}^{I,0}, s_{i,k}^{Q,m/2-1}, \ldots, s_{i,k}^{Q,0})$ and $S_{i,k}$ includes a real part $S_{i,k}^I$ and an imaginary part $S_{i,k}^Q$, each part including m/2 bits, wherein $m = \log_2 M$, m is an even number, i is a group number index, k is a complex modulation symbol sequence number and a minimum value of k is 0.

For $K_1 = (\log_2 M)/2$, the kth complex modulation symbol $S_{i,k}$ is obtained according to the following formulae:

the real part (I path): $(S_{i,k}^{I,m/2-1}, \ldots, S_{i,k}^{I,0}) = (c_{i,0}^k, c_{i,1}^k, \ldots, c_{i,K_1-1}^k)$, and the imaginary part (Q path): $(S_{i,k}^{Q,m/2-1}, \ldots S_{i,k}^{Q,0}) = (c_{i,0}^{k+p/2}, c_{i,1}^{k+p/2}, \ldots c_{i,K_1-1}^{k+p/2})$.

By the I/Q path mapping method, a group of 2 bits $(c_{i,0}^0 c_{i,1}^0)$ formed by $0^{th}$ bits of the binary bit sequences corresponding to respective multi-element codes in the $i^{th}$ group is mapped to a real part (I path) of a $0^{th}$ 16QAM symbol $S_{i,0}$ of the $i^{th}$ group, i.e. a binary bit sequence $(S_{i,0}^{I,1}, S_{i,0}^{I,0}) = (c_{i,0}^0 c_{i,1}^0)$ corresponding to the I path of $S_{i,0}$.

A group of 2 bits $(c_{i,0}{}^1 c_{i,1}{}^1)$ formed by first bits of the binary bit sequences corresponding to respective multi-element codes in the ith group is mapped to a real part (I path) of a first 16QAM symbol $S_{i,1}$ of the $i^{th}$ group, i.e. a binary bit sequence $(S_{i,1}{}^{I,1}, S_{i,1}{}^{I,0})=(c_{i,0}{}^1 c_{i,1}{}^1)$ corresponding to the I path of $S_{i,1}$.

A group of 2 bits $(c_{i,0}{}^2 c_{i,1}{}^2)$ formed by second bits of the binary bit sequences corresponding to respective multi-element codes in the $i^{th}$ group is mapped to a real part (I path) of a second 16QAM symbol $S_{i,2}$ of the $i^{th}$ group, i.e. a binary bit sequence $(S_{i,0}{}^{I,1}, S_{i,0}{}^{I,0})=(c_{i,0}{}^2 c_{i,1}{}^2)$ corresponding to the I path of $S_{i,2}$.

A group of 2 bits $(c_{i,0}{}^3 c_{i,1}{}^3)$ formed by third bits of the binary bit sequences corresponding to respective multi-element codes in the $i^{th}$ group is mapped to an imaginary part (Q path) of the $0^{th}$ 16QAM symbol $S_{i,0}$ of the $i^{th}$ group, i.e. a binary bit sequence $(S_{i,0}{}^{Q,1}, S_{i,0}{}^{Q,0})=(c_{i,0}{}^3 c_{i,1}{}^3)$ corresponding to the Q path of $S_{i,0}$.

A group of 2 bits $(c_{i,0}{}^4 c_{i,1}{}^4)$ formed by fourth bits of the binary bit sequences corresponding to respective multi-element codes in the $i^{th}$ group is mapped to an imaginary part (Q path) of the first 16QAM symbol $S_{i,1}$ of the $i^{th}$ group, i.e. a binary bit sequence $(S_{i,1}{}^{Q,1}, S_{i,1}{}^{Q,0})=(c_{i,0}{}^4 c_{i,1}{}^4)$ corresponding to the Q path of $S_{i,1}$.

A group of 2 bits $(c_{i,0}{}^5 c_{i,1}{}^5)$ formed by fifth bits of the binary bit sequences corresponding to respective multi-element codes in the $i^{th}$ group is mapped to an imaginary part (Q path) of the second 16QAM symbol $S_{i,2}$ of the $i^{th}$ group, i.e. a binary bit sequence $(S_{i,0}{}^{Q,1}, S_{i,0}{}^{Q,0})=(c_{i,0}{}^5 c_{i,1}{}^5)$ corresponding to the Q path of $S_{i,2}$.

In such a manner, the 2 multi-element codes $[C_{i,0}, C_{i,1}]$ of the $i^{th}$ group are mapped to the 3 16QAM symbols $[S_{i,0} S_{i,1} S_{i,2}]$ by the I/Q path mapping method; and the modulation symbols of each group are connected.

When being transmitted through a multipath Rayleigh fading channel, symbol $S_{i,0}$ passes through path $H_0$, symbol $S_{i,1}$ passes through path $H_1$, and symbol $S_{i,2}$ passes through path $H_2$. Signals received at a receiving side are $H_0^*(c_{i,0}{}^0 c_{i,1}{}^0 c_{i,2}{}^3 c_{i,3}{}^3)+n_0$, $H_1^*(c_{i,0}{}^1 c_{i,1}{}^1 c_{i,2}{}^4 c_{i,3}{}^4)+n_1$ and $H_2^*(c_{i,0}{}^2 c_{i,1}{}^2 c_{i,2}{}^5 c_{i,3}{}^5)+n_2$, respectively. Soft information of the first multi-element code obtained before decoding comes from $H_0^* c_{i,0}{}^0$, $H_0^* c_{i,0}{}^3$, $H_1^* c_{i,0}{}^1$, $H_1^* c_{i,0}{}^4$, $H_2^* c_{i,0}{}^2$ and $H_2^* c_{i,0}{}^5$, and soft information of each next multi-element code is all from the three paths $H_0$, $H_1$ and $H_2$, so that decoding performance is achieved by means of a diversity effect of the fading channel, and a fading diversity gain is obtained.

In the example, a value of k is ranged from 0 to a positive integer smaller than $K_2$; and a value of j is ranged from 0 to a positive integer smaller than p, wherein $p=\log_2 q$.

Example 3

The example is a specific application example based on interleaving mapping.

Figure 6:
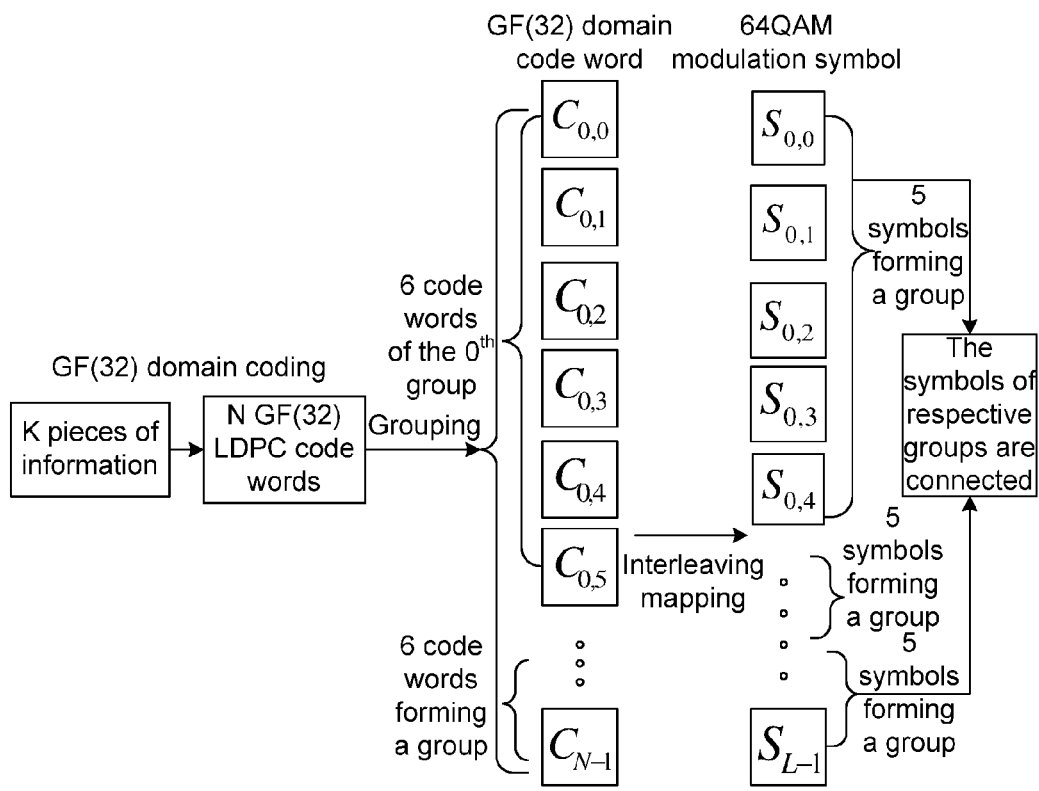
FIG. 6 is schematic diagram 1 showing a multi-element code modulation mapping method according to example 3.
Figure 7:
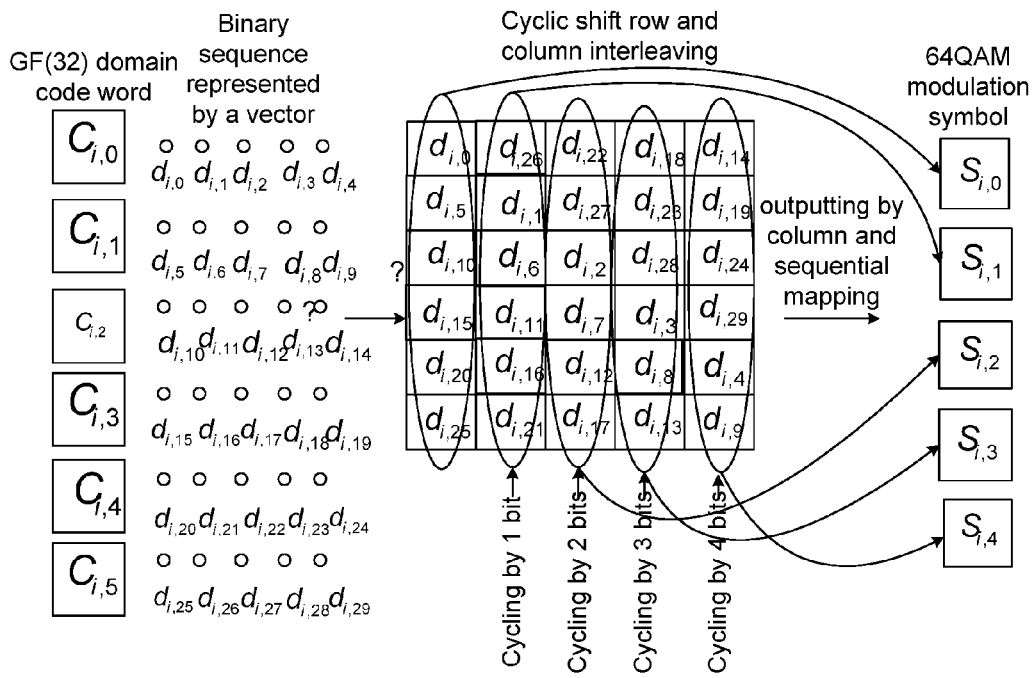
FIG. 7 is schematic diagram 2 showing a multi-element code modulation mapping method according to example 3.

As shown in FIG. 6 and FIG. 7, GF(32) LDPC coding is performed on a first sequence $A_0, A_1, \ldots, A_{K-1}$ including K multi-element codes to obtain a second sequence $B_0, B_1, \ldots, B_{N-1}$ including N multi-element codes.

If it is necessary to perform 16QAM mapping on the multi-element code sequence, then q=32 and M=64. $K_1=6$ and $K_2=5$ are calculated according to formula (1) and formula (2), wherein formula (1) is:

$$K_1 = \begin{cases} 2*m/p & \text{condition 1: if } m = n*p, \\ & \text{wherein } n \text{ is a positive integer more than 1;} \\ & \text{condition 2: if } p = n*m, \\ 2 & \text{wherein } n \text{ is a positive integer more than or} \\ & \text{equal to 1;} \\ (\text{least common multiple of } m \text{ and } p)/p & \text{if both} \\ & \text{condition 1 and 2 are not met.} \end{cases}$$

and formula (2) is: $K_2=K_1*p/m$.

$\lceil N/K_1 \rceil *K_1-N$ zero code words are added to the tail of the second sequence, and then the added multi-element code sequence with a length of $N_1=\lceil N/K_1 \rceil *K_1$ is divided into groups with each group including 6 multi-element codes.

Cyclic shift interleaving and mapping are sequentially performed when an interleaving mapping method is used, which includes the following steps:

Step a: for binary bit sequences corresponding to $K_1$ GF(q) domain multi-element codes of each input group, cyclic shift interleaving is performed on the binary bit sequences according to q and a modulation order M, and the binary bit sequences are cyclically interleaved; and Step b: the cyclically interleaved binary bit sequences are sequentially mapped to a constellation diagram, m bits of one group being modulated into a complex modulation symbol, $m=\log_2 M$ and the cyclically interleaved binary bit sequences being modulated into totally $K_2$ Mth-order complex modulation symbols.

A binary bit sequence corresponding to a GF(32) domain multi-element code sequence $C_{i,0} C_{i,1}, \ldots, C_{i,5}$ of an $i^{th}$ input group is $d_{i,0}, d_{i,1}, \ldots, d_{i,29}$.

Herein, a binary bit sequence corresponding to a $j^{th}$ GF(32) domain multi-element code $C_{i,j}$ is $d_{i,jp}, d_{i,jp+1}, \ldots, d_{i,(j+1)p-1}$, wherein $p=\log_2 q$; i is a group number index; and j is a sequence number of a multi-element code in the group, and a value of j is ranged from 0.

A binary bit sequence output after cyclic shift interleaving of the binary bit sequence is $e_{i,0}, e_{i,1}, \ldots, e_{i,29}$.

A 6*5 row and column interleaver is adopted to read the binary bit sequence $d_{i,0}, d_{i,1}, \ldots, d_{i,29}$ by row, and cyclic shift is performed on each column by certain bits from the second column. For example, the second column is cyclically shifted down by 1 bit, the third column is cyclically shifted down by 2 bits, the fourth column is cyclically shifted down by 3 bits, and the fifth column is cyclically shifted down by 4 bits. The interleaved binary bit sequence $e_{i,0}, e_{i,1}, \ldots, e_{i,29}$ is output by column after cyclic downward shift.

The input binary bit sequence is $d_{i,0}, d_{i,1}, \ldots, d_{i,29}$, the binary bit sequence output after interleaving is $e_{i,0}, e_{i,1}, \ldots, e_{i,29}$, and a formula is defined as follows:

$$d_{i,t} = e_{i,r},$$

wherein $r=((t \bmod p)*(m+1)+\lfloor t/m \rfloor) \bmod m+(t \bmod p)*m$; $m=\log_2 M=6$ and $p=\log_2 q=5$.

For example, for t=3, $r=((t \bmod p)*(m+1)+\lfloor t/m \rfloor) \bmod m+(t \bmod p)*m=21$, that is, $d_{i,3}=e_{i,21}$. For t=24, $r=((t \bmod p)*(m+1)+\lfloor t/m \rfloor) \bmod m+(t \bmod p)*m=26$, that is, $d_{i,4}=e_{i,26}$.

The bits are sequentially mapped to the constellation diagram, and the kth complex modulation symbol $S_{i,k}$ is obtained according to the following formula:

$$(S_{i,k}{}^{m-1}, \ldots, S_{i,k}{}^0) = (E_{i,km}, E_{i,km-1}, \ldots, E_{i,(k+1)m-1}).$$

A binary bit sequence corresponding to a 0th modulation symbol $S_{i,0}$ of the $i^{th}$ group is $(S_{i,0}^5 S_{i,0}^4 S_{i,0}^3 S_{i,0}^2 S_{i,0}^1 S_{i,0}^0)$= $(e_{i,0} e_{i,1} e_{i,2} e_{i,3} e_{i,4} e_{i,5}) = (d_{i,0} d_{i,5} d_{i,10} d_{i,15} d_{i,20} d_{i,25})$.

A binary bit sequence corresponding to a first modulation symbol $S_{i,1}$ of the $i^{th}$ group is $(S_{i,1}^5 S_{i,1}^4 S_{i,1}^3 S_{i,1}^2 S_{i,1}^1 S_{i,1}^0)$= $(e_{i,6} e_{i,7} e_{i,8} e_{i,9} e_{i,10} e_{i,11}) = (d_{i,26} d_{i,11} d_{i,6} d_{i,11} d_{i,16} d_{i,21})$.

A binary bit sequence corresponding to a second modulation symbol $S_{i,2}$ of the $i^{th}$ group is $(S_{i,2}^5 S_{i,2}^4 S_{i,2}^3 S_{i,2}^2 S_{i,2}^1 S_{i,2}^0) = (e_{i,12} e_{i,13} e_{i,14} e_{i,15} e_{i,16} e_{i,17}) = (d_{i,22} d_{i,27} d_{i,2} d_{i,7} d_{i,12} d_{i,17})$.

A binary bit sequence corresponding to a third modulation symbol $S_{i,3}$ of the $i^{th}$ group is $(S_{i,3}^5 S_{i,3}^4 S_{i,3}^3 S_{i,3}^2 S_{i,3}^1 S_{i,3}^0)$= $(e_{i,18} e_{i,19} e_{i,20} e_{i,21} e_{i,22} e_{i,23}) = (d_{i,18} d_{i,23} d_{i,28} d_{i,3} d_{i,8} d_{i,13})$.

A binary bit sequence corresponding to a fourth modulation symbol $S_{i,4}$ of the $i^{th}$ group is $(S_{i,4}^5 S_{i,4}^4 S_{i,4}^3 S_{i,4}^2 S_{i,4}^1 S_{i,4}^0) = (e_{i,24} e_{i,25} e_{i,26} e_{i,27} e_{i,28} e_{i,29}) = (d_{i,14} d_{i,19} d_{i,24} d_{i,29} d_{i,4} d_{i,9})$.

The 5 64QAM symbols $[S_{i,0} S_{i,1} S_{i,2} S_{i,3} S_{i,4}]$ are obtained, and then the modulation symbols of each group are connected. It can be seen that the $0^{th}$ bit of multi-element code $C_{i,0}$ is located at a fourth position of a constellation point of the $0^{th}$ modulation symbol, the first bit, i.e. $d_{i,6}$, of multi-element code $C_{i,0}$ is located at a third position of a constellation point of the first modulation symbol, the second bit, i.e. $d_{i,7}$, of multi-element code $C_{i,0}$ is located at a second position of a constellation point of the second modulation symbol, the third bit, i.e. $d_{i,8}$, of multi-element code $C_{i,0}$ is located at a first position of a constellation point of the third modulation symbol, and the fourth bit, i.e. $d_{i,9}$, of multi-element code $C_{i,0}$ is located at a $0^{th}$ position of a constellation point of the fourth modulation symbol. The other multi-element codes may also be uniformly mapped to different constellation point positions by such design, so that bits of the same multi-element code may be distributed at bits, with different reliability, of different modulation symbols, and in addition, a constellation point diversity gain and a fading diversity gain are obtained.

Herein, t is an index number, and is valued to be 0 or a positive integer smaller than $pK_1$; r is an index number, and is valued to be 0 or a positive integer smaller than $pK_1$; a value of k is ranged from 0 to a positive integer smaller than $K_2$; and a value of j is ranged from 0 to a positive integer smaller than p, wherein $p = \log_2 q$.

Example 4

The example is a specific application example based on second I/Q path interleaving mapping.

Figure 8:
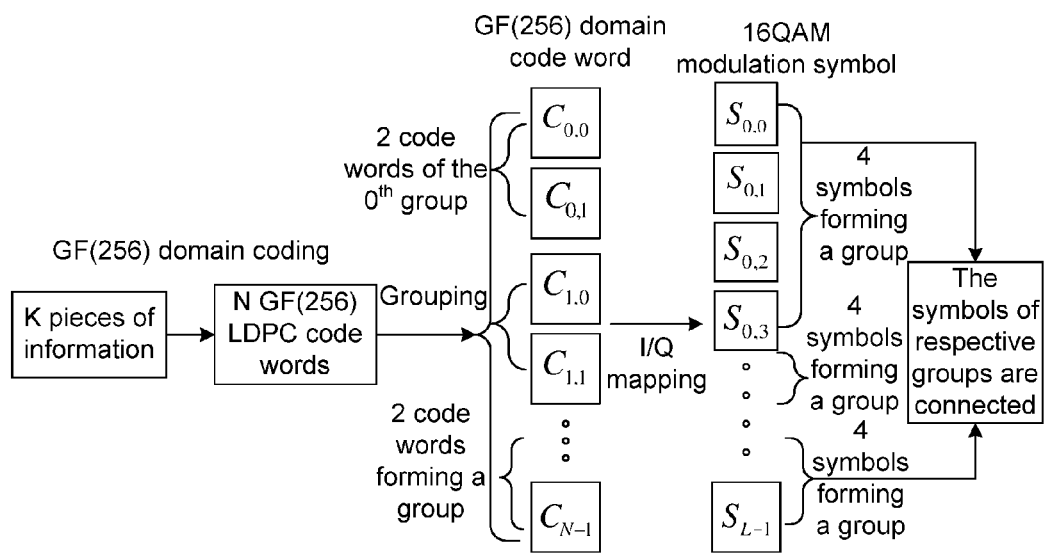
FIG. 8 is schematic diagram 1 showing a multi-element code modulation mapping method according to example 4.
Figure 9:
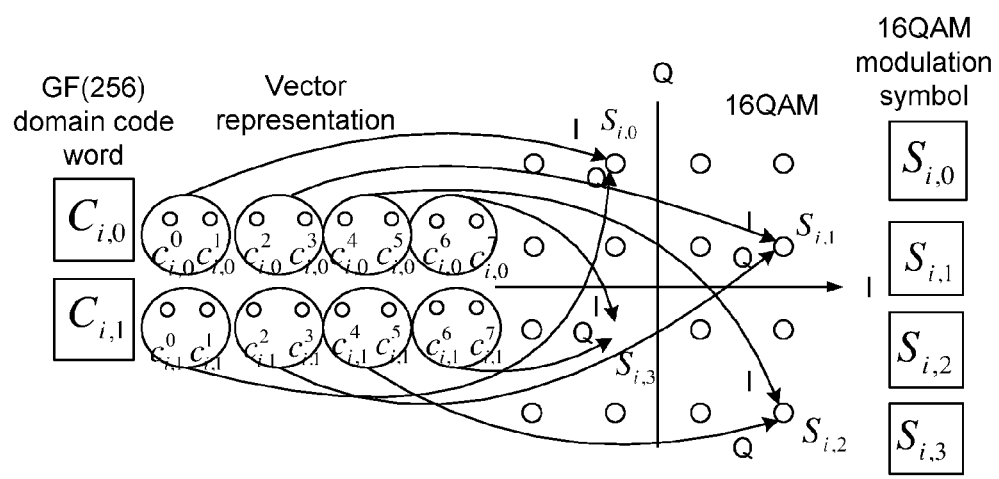
FIG. 9 is schematic diagram 2 showing a multi-element code modulation mapping method according to example 4.

As shown in FIG. 8 and FIG. 9, GF(256) LDPC coding is performed on a first sequence $A_0, A_1, \ldots, A_{K-1}$ including K multi-element codes to obtain a second sequence $B_0, B_1, \ldots, B_{N-1}$ including N multi-element codes.

If it is necessary to perform 16QAM mapping on the multi-element code sequence, then q=256, M=16 and p is double of m. $K_1 = 2$ and $K_2 = 4$ are calculated according to formula (1) and formula (2), wherein formula (1) is:

$$K_1 = \begin{cases} 2*m/p & \text{condition 1: if } m = n*p, \\ & \text{wherein } n \text{ is a positive integer more than 1;} \\ 2 & \text{condition 2: if } p = n*m, \\ & \text{wherein } n \text{ is a positive integer more than or equal to 1;} \\ (\text{least common multiple of } m \text{ and } p)/p & \text{if both condition 1 and 2 are not met.} \end{cases}$$

and formula (2) is: $K_2 = K_1 * p/m$.

$\lceil N/K_1 \rceil * K_1 - N$ zero code words are added after the second sequence, and then the added multi-element code sequence with a length of $N_1 = \lceil N/K_1 \rceil * K_1$ is divided into groups with each group including 4 multi-element codes.

A binary bit sequence $(c_{i,j}^0 c_{i,j}^1 c_{i,j}^2 c_{i,j}^3 c_{i,j}^4 c_{i,j}^5 c_{i,j}^6 c_{i,j}^7)$ corresponding to a $j^{th}$ GF(256) domain multi-element code $C_{i,j}$ in 2 coded GF(256) domain multi-element codes $[C_{i,0} C_{i,1}]$ of an $i^{th}$ group is modulated to form totally $K_2 = 4$ 16QAM symbols $S_{i,0} S_{i,1} S_{i,2}$.

For $K_1 = 2$, $p = \log_2 q = n*(\log_2 M)/2$, wherein $n = 4$, and is a positive integer more than or equal to 2, $K_1$ bits of each GF(q) domain multi-element code in a group of GF(q) domain multi-element codes input by I/Q mapping are sequentially modulated into a real part (i.e. I path) or imaginary part (i.e. Q path) of a complex modulation symbol, and the $K_1$ GF(q) domain multi-element codes are modulated into $K_2$ Mth-order modulation symbols, wherein the Mth-order modulation symbols are complex modulation symbols.

A kth complex modulation symbol $S_{i,k}$ corresponds to a binary bit sequence $(S_{i,k}^{I,m/2-1}, \ldots, S_{i,k}^{I,0}, S_{i,k}^{Q,m/2-1}, \ldots, S_{i,k}^{Q,0})$, and $S_{i,k}$ includes a real part $S_{i,k}^I$ and an imaginary part $S_{i,k}^Q$, each part including m/2 bits, wherein $m = \log_2 M$, m is an even number, i is a group number index, k is a complex modulation symbol sequence number and a value of k is ranged from 0.

The $k^{th}$ complex modulation symbol $S_{i,k}$ is obtained according to the following formulae:

the real part (I path): $(d_{i,k}^{I,m/2-1}, \ldots, d_{i,k}^{I,0}) = (c_{i,0}^{mk/2}, c_{i,0}^{mk/2+1}, \ldots, c_{i,0}^{m(k+1)/2-1})$, and the imaginary part (Q path): $(S_{i,k}^{Q,m/2-1}, \ldots S_{i,k}^{Q,0}) = (c_{i,1}^{mk/2}, c_{i,1}^{mk/2+1}, \ldots c_{i,1}^{m(k+1)/2-1})$.

By the I/Q path mapping method, 2 bits $(c_{i,0}^0 c_{i,0}^0)$ of a $0^{th}$ segment in a binary bit sequence $(c_{i,0}^0 c_{i,0}^1 c_{i,0}^2 c_{i,0}^3 c_{i,0}^4 c_{i,0}^5 c_{i,0}^6 c_{i,0}^7)$ corresponding to multi-element code $C_{i,0}$ in a multi-element code sequence of an $i^{th}$ group are mapped into a real part (I path) of a 0th 16QAM symbol $S_{i,0}$ of the ith group, m=4, k=0, i.e. a binary bit sequence $(S_{i,0}^{I,1}, S_{i,0}^{I,0}) = (c_{i,0}^0 c_{i,0}^1)$ corresponding to the I path of $S_{i,0}$.

2 bits $(c_{i,0}^2 c_{i,0}^3)$ of a first segment in the binary bit sequence $(c_{i,0}^0 c_{i,0}^1 c_{i,0}^2 c_{i,0}^3 c_{i,0}^4 c_{i,0}^5 c_{i,0}^6 c_{i,0}^7)$ corresponding to multi-element code $C_{i,0}$ in the multi-element code sequence of the $i^{th}$ group are mapped into a real part (I path) of a first 16QAM symbol $S_{i,1}$ of the $i^{th}$ group, m=4, k=1, i.e. a binary bit sequence $(S_{i,1}^{I,1}, S_{i,1}^{I,0}) = (c_{i,0}^2 c_{i,0}^3)$ corresponding to the I path of $S_{i,1}$.

2 bits $(c_{i,0}^4 c_{i,0}^5)$ of a second segment in the binary bit sequence $(c_{i,0}^0 c_{i,0}^1 c_{i,0}^2 c_{i,0}^3 c_{i,0}^4 c_{i,0}^5 c_{i,0}^6 c_{i,0}^7)$ corresponding to multi-element code $C_{i,0}$ in the multi-element code sequence of the $i^{th}$ group are mapped into a real part (I path) of a second 16QAM symbol $S_{i,2}$ of the $i^{th}$ group, m=4, k=2, i.e. a binary bit sequence $(S_{i,2}^{I,1}, S_{i,2}^{I,0}) = (c_{i,0}^4 c_{i,0}^5)$ corresponding to the I path of $S_{i,2}$.

2 bits $(c_{i,0}^6 c_{i,0}^7)$ of a third segment in the binary bit sequence $(c_{i,0}^0 c_{i,0}^1 c_{i,0}^2 c_{i,0}^3 c_{i,0}^4 c_{i,0}^5 c_{i,0}^6 c_{i,0}^7)$ corresponding to multi-element code $C_{i,0}$ in the multi-element code sequence of the $i^{th}$ group are mapped into a real part (I path) of a third 16QAM symbol $S_{i,3}$ of the $i^{th}$ group, m=4, k=3, i.e. a binary bit sequence $(S_{i,3}^{I,1}, S_{i,3}^{I,0}) = (c_{i,0}^6 c_{i,0}^7)$ corresponding to the I path of $S_{i,3}$.

2 bits $(c_{i,1}^0 c_{i,1}^1)$ of a $0^{th}$ segment in a binary bit sequence $(c_{i,1}^0 c_{i,1}^1 c_{i,1}^2 c_{i,1}^3 c_{i,1}^4 c_{i,1}^5 c_{i,1}^6 c_{i,1}^7)$ corresponding to multi-element code $C_{i,1}$ in the multi-element code sequence of the $i^{th}$ group are mapped into an imaginary part (Q path) of the $0^{th}$ 16QAM symbol $S_{i,0}$ of the $i^{th}$ group, m=4, k=0, i.e. a binary bit sequence $(S_{i,0}^{Q,1}, S_{i,0}^{Q,0}) = (c_{i,1}^0 c_{i,1}^1)$ corresponding to the Q path of $S_{i,0}$.

2 bits $(c_{i,1}^2 c_{i,1}^3)$ of a first segment in the binary bit sequence $(c_{i,1}^0 c_{i,1}^1 c_{i,1}^2 c_{i,1}^3 c_{i,1}^4 c_{i,1}^5 c_{i,1}^6 c_{i,1}^7)$ corresponding to multi-element code $C_{i,1}$ in the multi-element code sequence of the $i^{th}$ group are mapped into an imaginary part (Q path) of the first 16QAM symbol $S_{i,1}$ of the $i^{th}$ group, m=4, k=1, i.e. a binary bit sequence $(S_{i,1}^{Q,1}, S_{i,1}^{Q,0}) = (c_{i,1}^2 c_{i,1}^3)$ corresponding to the Q path of $S_{i,1}$.

2 bits $(c_{i,1}^4 c_{i,1}^5)$ of a second segment in the binary bit sequence $(c_{i,1}^0 c_{i,1}^1 c_{i,1}^2 c_{i,1}^3 c_{i,1}^4 c_{i,1}^5 c_{i,1}^6 c_{i,1}^7)$ corresponding to multi-element code $C_{i,1}$ in the multi-element code sequence of the $i^{th}$ group are mapped into an imaginary part (Q path) of the second 16QAM symbol $S_{i,2}$ of the $i^{th}$ group, m=4, k=2, i.e. a binary bit sequence $(S_{i,2}^{Q,1}, S_{i,2}^{Q,0}) = (c_{i,1}^4 c_{i,1}^5)$ corresponding to the Q path of $S_{i,2}$.

2 bits $(c_{i,1}^6 c_{i,1}^7)$ of a third segment in the binary bit sequence $(c_{i,1}^0 c_{i,1}^1 c_{i,1}^2 c_{i,1}^3 c_{i,1}^4 c_{i,1}^5 c_{i,1}^6 c_{i,1}^7)$ corresponding to multi-element code $C_{i,1}$ in the multi-element code sequence of the $i^{th}$ group are mapped into an imaginary part (Q path) of the third 16QAM symbol $S_{i,3}$ of the $i^{th}$ group, m=4, k=3, i.e. a binary bit sequence $(S_{i,3}^{Q,1}, S_{i,3}^{Q,0}) = (c_{i,1}^6 c_{i,1}^7)$ corresponding to the Q path of $S_{i,3}$.

In such a manner, the 2 multi-element codes $[C_{i,0}, C_{i,1}]$ of the $i^{th}$ group are mapped to the 4 16QAM symbols $[S_{i,0} S_{i,1} S_{i,2}]$ by the I/Q path mapping method. A connection node connects the modulation symbols of each group to each other.

When being transmitted through a multipath Rayleigh fading channel, symbol $S_{i,0}$ passes through path $H_0$, symbol $S_{i,1}$ passes through path $H_1$, symbol $S_{i,2}$ passes through path $H_2$, and symbol $S_{i,3}$ passes through path $H_3$. Signals received at a receiving side are $H_0*(c_{i,0}^0 c_{i,1}^0 c_{i,1}^1)+n_0$, $H_1*(c_{i,0}^2 c_{i,0}^3 c_{i,1}^2 c_{i,1}^3)+n_1$, $H_2*(c_{i,0}^4 c_{i,0}^5 c_{i,1}^4 c_{i,1}^5)+n_2$ and $H_3*(c_{i,0}^6 c_{i,0}^7 c_{i,1}^6 c_{i,1}^7)+n_3$, respectively. Soft information of the first multi-element code obtained before decoding comes from $H_0*c_{i,0}^0$, $H_0*c_{i,0}^1$, $H_1*c_{i,0}^2$, $H_1*c_{i,0}^3$, $H_2*c_{i,0}^4$, $H_2*c_{i,0}^5$, $H_3*c_{i,0}^6$ and $H_3*c_{i,0}^7$, and soft information of each next multi-element code is all from the four paths $H_0$, $H_1$, $H_2$ and $H_3$, so that decoding performance is achieved by means of a diversity effect of the fading channel, and a fading diversity gain is obtained.

Embodiment 2

Figure 10:
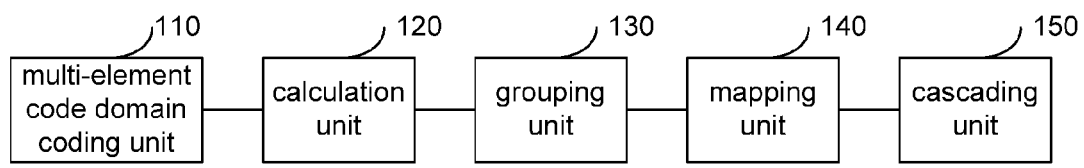
FIG. 10 is a structural diagram illustrating a multi-element code modulation mapping device according to embodiment 2 of the present disclosure.

As shown in FIG. 10, the embodiment provides a multi-element code modulation mapping device, which includes:

a multi-element domain coding unit 110, configured to perform multi-element domain coding on a first sequence including K multi-element codes to obtain a second sequence including N multi-element codes, wherein N=K/u, and u is usually a positive number smaller than 1;

a calculation unit 120, configured to calculate $K_1$ and $K_2$ according to a multi-element domain element number q and a modulation order M, wherein $K_1*\log_2 q = K_2*\log_2 M$, $K_1$ and $K_2$ are both integers not smaller than 2, and q and M are both power of 2;

a grouping unit 130, configured to divide the second sequence into z groups of multi-element codes with each group including $K_1$ multi-element codes, wherein $z=\lceil N/K_1 \rceil$, and $\lceil\ \rceil$ represents rounding up;

a mapping unit 140, configured to map each group of multi-element codes to a constellation diagram to form $K_2$ Mth-order modulation symbols, wherein each group of multi-element codes is mapped to at least two Mth-order modulation symbols; and a cascading unit 150, configured to sequentially cascade z groups of Mth-order modulation symbols to form a modulation symbol to be sent.

The multi-element domain coding unit 110, the calculation unit 120, the grouping unit 130, the mapping unit 140 and the cascading unit 150 may collectively be called functional units. The functional units may independently or integrally correspond to a device including a processor, a storage medium, a bus and at least one communication interface. The storage medium includes a transient storage medium and a non-transient storage medium. The transient storage medium may be configured for caching and the non-transient storage medium may be configured to store data, programs or software required to be stored for long. Data stored on the non-transient storage medium may still be stored under the condition of sudden power failure. The bus connects the processor, the storage medium and the communication interfaces to implement data communication within the device. Programs or software are stored on the non-transient storage medium, and the processor may run the programs or the software to implement any technical solution of the multi-element code modulation mapping method described in embodiment 1. The processor may be a structure such as a central processing unit, a single-chip microcomputer, a digital signal processor or a programmable array. The processor may also be the sum of electronic components and parts with special processing functions, and the calculation unit may specifically be a calculator.

Preferably, if m=n*p, $K_1$=2*m/p;

if p=n*m, $K_1$=2; and if m is unequal to n*p and p is unequal to n*m, $K_1$=Y/p, wherein m=$\log_2$ M and p=$\log_2$ q; Y is a least common multiple of m and p; and n is a positive integer.

The grouping unit 130 includes:

an addition module, configured to add $\lceil N/K_1 \rceil * K_1 - N$ zero code words to the second sequence to form a third sequence including $N_1$ multi-element codes, wherein $N_1 = \lceil N/K_1 \rceil * K_1$; and a group forming module, configured to group the third sequence to obtain the z groups of multi-element codes with each group including $K_1$ multi-element codes according to formula $C_{i,j} = B_{i \cdot K_1 + j}$. The group forming module is specifically configured to sequentially group the third sequence backwards from a starting position of the third sequence by taking continuous $K_1$ multi-element codes as a group, wherein $C_{i,j}$ is a $j^{th}$ multi-element code in an $i^{th}$ group, and $B_{i \cdot K_1 + j}$ is an $(i \cdot K_1 + j)^{th}$ multi-element code in the third sequence, and wherein i is 0 or a positive integer smaller than z; and j is 0 or a positive integer smaller than $K_1$.

The mapping unit is configured to map each group of multi-element codes to the constellation diagram by adopting a direct total mapping, I/Q path mapping or interleaving mapping method. With respect to different methods for implementing mapping, the mapping unit may use the different structures, and four structures are provided below.

Structure 1

The mapping unit includes:

a first mapping module, configured to, when $K_1 = \log_2 M$, extract $k^{th}$ bit in a binary bit sequence corresponding to each multi-element code in the $i^{th}$ group of multi-element codes $C_{i,0}, C_{i,1}, \ldots, C_{i,K_1-1}$ to form a $k^{th}$ Mth-order complex modulation symbol $S_{i,k}$ for mapping according to formula $(S_{i,k}^{m-1}, \ldots, S_{i,k}^0) = (c_{i,0}^k, c_{i,1}^k, \ldots, c_{i,K_1-1}^k)$, and map $S_{i,k}$ to the constellation diagram, wherein $(S_{i,k}^{m-1}, \ldots, S_{i,k}^0)$ is a binary bit sequence corresponding to $S_{i,k}$; m=$\log_2$ M;

the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; p=$\log_2$ q; $c_{i,j}^k$ represents the $k^{th}$ bit of the binary bit sequence corresponding to the $j^{th}$ multi-element code in the $i^{th}$ group;

i is 0 or a positive integer smaller than z;

j is 0 or a positive integer smaller than $K_1$; and k is 0 or a positive integer smaller than $K_2$.

Structure 2

The mapping unit includes:

a second mapping module, configured to, when $K_1=(\log_2 M)/2$, extract the $k^{th}$ bit in the binary bit sequence corresponding to each multi-element code in the $i^{th}$ group of multi-element codes $C_{i,0}, C_{i,1}, \ldots, C_{i,K_1-1}$ to form a real part or imaginary part of the Mth-order modulation symbol $S_{i,k}$ according to formula $(S_{i,k}^{I,m/2-1}, \ldots, S_{i,k}^{I,0}) = (c_{i,0}^k c_{i,1}^k, \ldots, c_{i,K_1-1}^k)$ and formula $(S_{i,k}^{Q,m/2-1}, \ldots, S_{i,k}^{Q,0}) = (c_{i,0}^{k+p/2}, c_{i,1}^{k+p/2}, \ldots c_{i,K_1-1}^{k+p/2})$, wherein $(S_{i,k}^{I,m/2-1}, \ldots, S_{i,k}^{I,0})$ is the real part $S_{i,k}^I$ of $S_{i,k}$; $(S_{i,k}^{Q,m/2-1}, \ldots, S_{i,k}^{Q,0})$ is the imaginary part $S_{i,k}^Q$ of $S_{i,k}$; $m=\log_2 M$; $p=\log_2 q$.

The binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p=\log_2 q$; and $c_{i,j}^k$ represents the $k^{th}$ bit of the binary bit sequence corresponding to the $j^{th}$ multi-element code in the $i^{th}$ group, wherein i is 0 or a positive integer smaller than z;

j is 0 or a positive integer smaller than $K_1$; and k is 0 or a positive integer smaller than $K_2$.

Structure 3

The mapping unit includes:

a third mapping module, configured to, when $K_1=2$ and $p=\log_2 q=n*(\log_2 M)/2$, extract continuous m/2 bits in the binary bit sequence corresponding to each multi-element code in the $i^{th}$ group of multi-element codes $C_{i,0}, C_{i,1}, \ldots, C_{i,K_1-1}$ to form the real part or imaginary part of the Mth-order modulation symbol $S_{i,k}$ according to formula $(S_{i,k}^{I,m/2-1}, \ldots, S_{i,k}^{I,0}) = (c_{i,0}^{mk/2}, c_{i,0}^{mk/2+1}, \ldots, c_{i,0}^{m(k+1)/2-1})$ and formula $(S_{i,k}^{Q,m/2-1}, \ldots, S_{i,k}^{Q,0}) = (c_{i,1}^{mk/2} c_{i,1}^{mk/2+1}, \ldots c_{i,1}^{m(k+1)/2-1})$, wherein $(S_{i,k}^{I,m/2-1}, \ldots, S_{i,k}^{I,0})$ is the real part of $S_{i,k}$; $(S_{i,k}^{Q,m/2-1}, \ldots, S_{i,k}^{Q,0})$ is the imaginary part $S_{i,k}^Q$ of $S_{i,k}$; $m=\log_2 M$;

the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p=\log_2 q$; $c_{i,j}^k$ represents the $k^{th}$ bit of the binary bit sequence corresponding to the $j^{th}$ multi-element code in the $i^{th}$ group;

i is 0 or a positive integer smaller than z;

j is 0 or a positive integer smaller than $K_1$; and k is 0 or a positive integer smaller than $K_2$.

Structure 4

The mapping unit includes:

a fourth mapping module, configured to acquire a binary bit sequence $(S_{i,k}^{m/2-1}, \ldots, S_{i,k}^0)$ corresponding to the Mth-order modulation symbol $S_{i,k}$ according to formula $(s_{i,k}^{m-1}, \ldots, s_{i,k}^0) = (E_{i,km}, E_{i,km+1}, \ldots, E_{i,(k+1)m-1})$, and sequentially map $S_{i,k}$ to the constellation diagram;

an interleaving module, configured to, when $K_1=\log_2 M$, obtain a binary bit sequence $e_{i,0}, e_{i,1}, \ldots, e_{i,pK_1-1}$ obtained after cyclic interleaving of a binary bit sequence $d_{i,0}, d_{i,1}, \ldots, d_{i,pK_1-1}$ corresponding to the ith group of multi-element codes $C_{i,0}, C_{i,1}, \ldots, C_{i,K_1-1}$ according to formulae $r=((t \bmod p)*(m+1)+\lfloor t/m \rfloor) \bmod m + (t \bmod p)*m$ and $d_{i,t}=e_{i,r}$; and a fourth mapping module, configured to acquire a binary bit sequence $(S_{i,k}^{m/2-1}, \ldots, S_{i,k}^0)$ corresponding to the Mth-order modulation symbol $S_{i,k}$ according to formula $(S_{i,k}^{m-1}, \ldots, S_{i,k}^0) = (e_{i,km}, e_{i,km+1}, \ldots, e_{i,(k+1)m-1})$, and sequentially map $S_{i,k}$ to the constellation diagram, wherein $m=\log_2 M$; $p=\log_2 q$;

the binary bit sequence corresponding to the $j^{th}$ multi-element code $C_{i,j}$ in the $i^{th}$ group is $c_{i,j}^0, c_{i,j}^1, \ldots, c_{i,j}^{p-1}$;

$d_{i,t}$ is a $t^{th}$ bit of the binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$, and t is an index number, and is valued to be 0 or a positive integer smaller than $pK_1$;

$e_{i,r}$ is an $r^{th}$ bit of the binary bit sequence $e_{i,0}, e_{i,1}, \ldots, e_{i,pK_1-1}$ output after cyclic interleaving of the binary bit sequence of the $i^{th}$ group, and r is an index number, and is valued to be 0 or a positive integer smaller than $pK_1$; and k is 0 or a positive integer smaller than $K_2$.

In a specific implementation process, the mapping unit may further include a conversion module; and the conversion module is configured to convert each multi-element code into a binary bit sequence.

The multi-element code modulation mapping device of the embodiment provides a physical device for implementing the multi-element code modulation mapping method of embodiment 1 and may be configured to implement any technical solution in embodiment 1. Specific structure may be a communication node such as a base station or a terminal. For modulation symbols formed by the multi-element code modulation mapping device of the embodiment, the same multi-element code is mapped to multiple modulation symbols, so that a diversity gain of a fading channel is increased; and moreover, different modulation symbols are mapped to different constellation points of the constellation diagram, so that performance loss caused by different stability of the constellation points in the constellation diagram is well reduced, and communication quality is improved.

Embodiment 3

The embodiment of the present disclosure further records a computer storage medium having computer-executable instructions stored therein, wherein the computer-executable instructions are configured to implement at least one of the methods described in embodiment 1 or the examples, specifically the method shown in FIG. 1.

The computer storage medium includes: various media capable of storing program codes such as mobile storage equipment, a Read-Only Memory (ROM), a Random Access Memory (RAM), a magnetic disk or a compact disc, and is preferably a non-transient storage medium.

The above is only the preferred embodiments of the present disclosure and not intended to limit the scope of protection of the present disclosure. Any modification made according to the principle of the present disclosure shall fall within the scope of protection of the present disclosure.

The invention claimed is:

1. A multi-element code modulation mapping method, comprising:

performing multi-element domain coding on a first sequence comprising K multi-element codes to obtain a second sequence comprising N multi-element codes;

calculating $K_1$ and $K_2$ according to a multi-element domain element number q and a modulation order M, wherein $K_1*\log_2 q = K_2*\log_2 M$, $K_1$ and $K_2$ are both integers not smaller than 2, and q and M are both power of 2;

dividing the second sequence into z groups of multi-element codes with each group comprising $K_1$ multi-element codes, wherein $z=\lceil N/K_1 \rceil$, and $\lceil \rceil$ represents rounding up;

mapping each group of multi-element codes to a constellation diagram to form $K_2$ Mth-order modulation symbols, wherein each group of multi-element codes is mapped to at least two Mth-order modulation symbols; and sequentially cascading z groups of Mth-order modulation symbols to form a modulation symbol to be sent.

2. The method according to claim 1, wherein
$\log_2 M=m$ and $\log_2 q=p$; a least common multiple of m and p is Y; n is a positive integer;
if $m=n*p$, $K_1=2*m/p$;
if $p=n*m$, $K_1=2$; and
if m is unequal to $n*p$ and p is unequal to $n*m$, $K_1=Y/p$.

3. The method according to claim 1, wherein the step of dividing the second sequence into the z groups of multi-element codes with each group comprising $K_1$ multi-element codes comprises:
adding $\lceil N/K_1 \rceil * K_1 - N$ zero code words to the second sequence to form a third sequence comprising $N_1$ multi-element codes, wherein $N_1 = \lceil N/K_1 \rceil * K_1$; and
dividing the third sequence into the z groups of multi-element codes with each group comprising $K_1$ multi-element codes.

4. The method according to claim 3, wherein the step of dividing the third sequence into the z groups of multi-element codes with each group comprising $K_1$ multi-element codes is implemented by:
sequentially grouping the third sequence backwards from a starting position of the third sequence according to formula $C_{i,j}=B_{i \cdot K_1+j}$ by taking continuous $K_1$ multi-element codes as a group,
wherein $C_{i,j}$ is a $j^{th}$ multi-element code in an $i^{th}$ group; $B_{i \cdot K_1+j}$ is an $(i \cdot K_1+j)^{th}$ multi-element code in the third sequence; and
wherein i is 0 or a positive integer smaller than z; and j is 0 or a positive integer smaller than $K_1$.

5. The method according to claim 1, wherein the step of mapping each group of multi-element codes to the constellation diagram is implemented by:
mapping each group of multi-element codes to the constellation diagram by adopting a direct total mapping, In-phase/Quadrature (I/Q) path mapping or interleaving mapping method.

6. The method according to claim 5, wherein the step of mapping each group of multi-element codes to the constellation diagram by adopting the direct total mapping method comprises:
when $K_1=\log_2 M$, extracting a $k^{th}$ bit in binary bit sequence corresponding to each multi-element code in the $i^{th}$ group of multi-element codes $C_{i,0}, C_{i,1}, \ldots, C_{i,K_1-1}$ to form a $k^{th}$ Mth-order complex modulation symbol $S_{i,k}$ for mapping according to formula $(S_{i,k}^{m-1}, \ldots, S_{i,k}^0)=(c_{i,0}^k, c_{i,1}^k, \ldots, c_{i,K_1-1}^k)$ and mapping $S_{i,k}$ to the constellation diagram,
wherein $(S_{i,k}^{m-1}, \ldots, S_{i,k}^0)$ is a binary bit sequence corresponding to the modulation symbol $S_{i,k}$; $M=\log_2 M$;
the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p=\log_2 q$; $c_{i,j}^k$ represents the $k^{th}$ bit of the binary bit sequence corresponding to the $j^{th}$ multi-element code in the $i^{th}$ group;
i is 0 or a positive integer smaller than z;
j is 0 or a positive integer smaller than $K_1$; and
k is 0 or a positive integer smaller than $K_2$.

7. The method according to claim 5, wherein the step of mapping each group of multi-element codes to the constellation diagram by adopting the I/Q path mapping method comprises:
when $K_1=(\log_2 M)/2$, extracting a $k^{th}$ bit in the binary bit sequence corresponding to each multi-element code in the $i^{th}$ group of multi-element codes $C_{i,0}, C_{i,1}, \ldots, C_{i,K_1-1}$ to form a real part or imaginary part of Mth-order modulation symbol $S_{i,k}$ according to formula $(S_{i,k}^{I,m/2-1}, \ldots, S_{i,k}^{I,0})=(c_{i,0}^k, c_{i,1}^k, \ldots, c_{i,K_1-1}^k)$ and formula $(S_{i,k}^{Q,m/2-1}, \ldots, S_{i,k}^{Q,0})=(c_{i,0}^{k+p/2}, c_{i,1}^{k+p/2}, \ldots c_{i,K_1-1}^{k+p/2})$,
wherein $(S_{i,k}^{I,m/2-1}, \ldots, S_{i,k}^{I,0})$ is the real part $S_{i,k}^I$ of $S_{i,k}$; $(S_{i,k}^{Q,m/2-1}, \ldots, S_{i,k}^{Q,0})$ is the imaginary part $S_{i,k}^Q$ of $S_{i,k}$; $m=\log_2 M$; $p=\log_2 q$;
the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p=\log_2 q$; $c_{i,j}^k$ represents the $k^{th}$ bit of the binary bit sequence corresponding to the $j^{th}$ multi-element code in the $i^{th}$ group;
i is 0 or a positive integer smaller than z;
j is 0 or a positive integer smaller than $K_1$; and
k is 0 or a positive integer smaller than $K_2$.

8. The method according to claim 5, wherein the step of mapping each group of multi-element codes to the constellation diagram by adopting the I/Q path mapping method comprises:
when $K_1=2$ and $p=\log_2 q=n*(\log_2 M)/2$, extracting continuous m/2 bits in the binary bit sequence corresponding to each multi-element code in the $i^{th}$ group of multi-element codes $C_{i,0}, C_{i,1}, \ldots, C_{i,K_1-1}$ to form a real part or imaginary part of the Mth-order modulation symbol $S_{i,k}$ according to formula $(S_{i,k}^{I,m/2-1}, \ldots, S_{i,k}^{I,0})=(c_{i,0}^{mk/2}, c_{i,0}^{mk/2+1}, \ldots, c_{i,0}^{m(k+1)/2-1})$ and formula $(S_{i,k}^{Q,m/2-1}, \ldots, S_{i,k}^{Q,0})=(c_{i,1}^{mk/2}, c_{i,1}^{mk/2+1}, \ldots c_{i,1}^{m(k+1)/2-1})$,
wherein $(S_{i,k}^{I,m/2-1}, \ldots, S_{i,k}^{I,0})$ is the real part of $S_{i,k}$; $(S_{i,k}^{Q,m/2-1}, \ldots, S_{i,k}^{Q,0})$ is the imaginary part $S_{i,k}^Q$ of $S_{i,k}$; $m=\log_2 M$;
the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p=\log_2 q$; $c_{i,j}^k$ represents the $k^{th}$ bit of the binary bit sequence corresponding to the $j^{th}$ multi-element code in the $i^{th}$ group;
i is 0 or a positive integer smaller than z;
j is 0 or a positive integer smaller than $K_1$; and
k is 0 or a positive integer smaller than $K_2$.

9. The method according to claim 5, wherein the step of mapping each group of multi-element codes to the constellation diagram by adopting the interleaving mapping method comprises:
when $K_1=\log_2 M$, obtaining a binary bit sequence $e_{i,0}, e_{i,1}, \ldots, e_{i,pK_1-1}$ by cyclic interleaving a binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$ according to formulae $r=((t \bmod p)*(m+1)+\lfloor t/m \rfloor) \bmod m+(t \bmod p)*m$ and $d_{i,t}=e_{i,r}$; and
acquiring a binary bit sequence $(S_{i,k}^{m/2-1}, \ldots, S_{i,k}^0)$ corresponding to the Mth-order modulation symbol $S_{i,k}$ according to formula $(S_{i,k}^{m-1}, \ldots, S_{i,k}^0)=(e_{i,km}, e_{i,km+1}, \ldots, e_{i,(k+1)m-1})$, and sequentially mapping $S_{i,k}$ to the constellation diagram,
wherein $m=\log_2 M$; $p=\log_2 q$;
the binary bit sequence corresponding to the $j^{th}$ multi-element code $C_{i,j}$ in the $i^{th}$ group is $c_{i,j}^0, c_{i,j}^1, \ldots, c_{i,j}^{p-1}$;
$d_{i,t}$ is a $t^{th}$ bit of the binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$, and t is an index number, and is valued to be 0 or a positive integer smaller than $pK_1$;
$e_{i,r}$ is an $r^{th}$ bit of the binary bit sequence $e_{i,0}, e_{i,1}, \ldots, e_{i,pK_1-1}$ output after cyclic interleaving of the binary bit sequence of the $i^{th}$ group, and r is an index number, and is valued to be 0 or a positive integer smaller than $pK_1$; and k is 0 or a positive integer smaller than $K_2$.

10. A multi-element code modulation mapping device, comprising:
a processor; and
a memory having instructions stored therein, the instructions when executed by the processor, cause the processor to:
perform multi-element domain coding on a first sequence comprising K multi-element codes to obtain a second sequence comprising N multi-element codes;
calculate $K_1$ and $K_2$ according to a multi-element domain element number q and a modulation order M, wherein $K_1 * \log_2 q = K_2 * \log_2 M$, $K_1$ and $K_2$ are both integers not smaller than 2, and q and M are both power of 2;
divide the second sequence into z groups of multi-element codes with each group comprising $K_1$ multi-element codes, wherein $z = \lceil N/K_1 \rceil$, and $\lceil \ \rceil$ represents rounding up;
map each group of multi-element codes to a constellation diagram to form $K_2$ Mth-order modulation symbols, wherein each group of multi-element codes is mapped to at least two Mth-order modulation symbols; and
sequentially cascade z groups of Mth-order modulation symbols to form a modulation symbol to be sent.

11. The device according to claim 10, wherein
$\log_2 M = m$ and $\log_2 q = p$; a least common multiple of m and p is Y; n is a positive integer;
if $m = n*p$, $K_1 = 2*m/p$;
if $p = n*m$, $K_1 = 2$; and
if m is unequal to $n*p$ and p is unequal to $n*m$, $K_1 = Y/p$.

12. The device according to claim 10, wherein the instructions when executed by the processor, further cause the processor to:
add $\lceil N/K_1 \rceil * K_1 - N$ zero code words to the second sequence to form a third sequence comprising $N_1$ multi-element codes, wherein $N_1 = \lceil N/K_1 \rceil * K_1$; and
divide the third sequence into the z groups of multi-element codes with each group comprising $K_1$ multi-element codes.

13. The device according to claim 12, wherein the instructions when executed by the processor, further cause the processor sequentially group the third sequence backwards from a starting position of the third sequence according to formula $C_{i,j} = B_{i \cdot K_1 + j}$ by taking continuous $K_1$ multi-element codes as a group;
$C_{i,j}$ is a $j^{th}$ multi-element code in an $i^{th}$ group; and $B_{i \cdot K_1 + j}$ is an $(i \cdot K_1 + j)^{th}$ multi-element code in the third sequence,
wherein i is 0 or a positive integer smaller than z; and
j is 0 or a positive integer smaller than $K_1$.

14. The device according to claim 10, wherein the instructions when executed by the processor, further cause the processor to map each group of multi-element codes to the constellation diagram by adopting a direct total mapping, I/Q path mapping or interleaving mapping method.

15. The device according to claim 14, wherein the instructions when executed by the processor, further cause the processor to
when $K_1 = \log_2 M$, extract a $k^{th}$ bits in binary bit sequence corresponding to each multi-element code in the $i^{th}$ group of multi-element codes $C_{i,0}, C_{i,1}, \ldots, C_{i,K_1-1}$ to form a $k^{th}$ Mth-order complex modulation symbol $S_{i,k}$ for mapping according to formula $(S_{i,k}^{m-1}, \ldots, S_{i,k}^{0}) = (c_{i,0}^k, c_{i,1}^k, \ldots, c_{i,K_1-1}^k)$, and mapping $S_{i,k}$ to the constellation diagram,
wherein $(S_{i,k}^{m-1}, \ldots, S_{i,k}^{0})$ is a binary bit sequence corresponding to $s_{i,k}$; $m = \log_2 M$;
the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p = \log_2 q$; $c_{i,j}^k$ represents the $k^{th}$ bit of the binary bit sequence corresponding to the $j^{th}$ multi-element code in the $i^{th}$ group;
i is 0 or a positive integer smaller than z;
j is 0 or a positive integer smaller than $K_1$; and
k is 0 or a positive integer smaller than $K_2$.

16. The device according to claim 14, wherein the instructions when executed by the processor, further cause the processor to:
when $K_1 = (\log_2 M)/2$, extract a $k^{th}$ bit in the binary bit sequence corresponding to each multi-element code in the $i^{th}$ group of multi-element codes $C_{i,0}, C_{i,1}, \ldots, C_{i,K_1-1}$ to form a real part or imaginary part of the Mth-order modulation symbol $S_{i,k}$ according to formula $(S_{i,k}^{I,m/2-1}, \ldots, S_{i,k}^{I,0}) = (c_{i,0}^k, c_{i,1}^k, \ldots, c_{i,K_1-1}^k)$ and formula $(S_{i,k}^{Q,m/2-1}, \ldots, S_{i,k}^{Q,0}) = (c_{i,0}^{k+p/2}, c_{i,1}^{k+p/2}, \ldots c_{i,K_1-1}^{k+p/2})$, wherein $(S_{i,k}^{I,m/2-1}, \ldots, S_{i,k}^{I,0})$ is the real part $S_{i,k}^I$ of $S_{i,k}$; $(S_{i,k}^{Q,m/2-1}, \ldots, S_{i,k}^{Q,0})$ is the imaginary part $S_{i,k}^Q$ of $S_{i,k}$; $m = \log_2 M$; $p = \log_2 q$;
the binary bit sequence corresponding to the jth multi-element code $C_{i,j}$ in the $i^{th}$ group is $c_{i,j}^0, c_{i,j}^1, \ldots, c_{i,j}^{p-1}$; $p = \log_2 q$; $c_{i,j}^k$ represents the $k^{th}$ bit of the binary bit sequence corresponding to the $j^{th}$ multi-element code in the $i^{th}$ group;
i is 0 or a positive integer smaller than z;
j is 0 or a positive integer smaller than $K_1$; and
k is 0 or a positive integer smaller than $K_2$.

17. The device according to claim 14, wherein the instructions when executed by the processor, further cause the processor to:
when $K_1 = 2$ and $p = \log_2 q = n*(\log_2 M)/2$, extract continuous m/2 bits in the binary bit sequence corresponding to each multi-element code in the $i^{th}$ group of multi-element codes $C_{i,0}, C_{i,1}, \ldots, C_{i,K_1-1}$ to form the real part or imaginary part of the Mth-order modulation symbol $S_{i,k}$ according to formula $(S_{i,k}^{I,m/2-1}, \ldots, S_{i,k}^{I,0}) = (c_{i,0}^{mk/2}, c_{i,0}^{mk/2+1}, \ldots, c_{i,0}^{m(k+1)/2-1})$ and formula $(S_{i,k}^{Q,m/2-1}, \ldots, S_{i,k}^{Q,0}) = (c_{i,1}^{mk/2}, c_{i,1}^{mk/2+1}, \ldots, c_{i,1}^{m(k+1)/2-1})$,
wherein $(S_{i,k}^{I,m/2-1}, \ldots, S_{i,k}^{I,0})$ is the real part of $S_{i,k}$; $(S_{i,k}^{Q,m/2-1}, \ldots, S_{i,k}^{Q,0})$ is the imaginary part $S_{i,k}^Q$ of $S_{i,k}$; $m = \log_2 M$;
the binary bit sequence corresponding to the $j^{th}$ multi-element code $C_{i,j}$ in the $i^{th}$ group is $c_{i,j}^0, c_{i,j}^1, \ldots, c_{i,j}^{p-1}$; $p = \log_2 q$; $c_{i,j}^k$ represents the $k^{th}$ bit of the binary bit sequence corresponding to the $j^{th}$ multi-element code in the $i^{th}$ group;
i is 0 or a positive integer smaller than z;
j is 0 or a positive integer smaller than $K_1$; and
k is 0 or a positive integer smaller than $K_2$.

18. The device according to claim 14, wherein the instructions when executed by the processor, further cause the processor to:
when $K_1 = \log_2 M$, obtain a binary bit sequence $e_{i,0}, e_{i,1}, \ldots, e_{i,pK_1-1}$ by cyclic interleaving a binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$ according to formulae $r = ((t \bmod p)*(m+1) + \lfloor t/m \rfloor) \bmod m + (t \bmod p)*m$ and $d_{i,t} = e_{i,r}$; and acquire a binary bit sequence $(S_{i,k}^{m/2-1}, \ldots, S_{i,k}^{0})$ corresponding to the Mth-order modulation symbol $S_{i,k}$ according to formula $(S_{i,k}^{m-1}, \ldots, S_{i,k}^{0})=(e_{i,km}, e_{i,km+1}, \ldots, e_{i,(k+1)m-1})$ and sequentially map $S_{i,k}$ to the constellation diagram, wherein $m=\log_2 M$; $p=\log_2 q$;

the binary bit sequence corresponding to the $j^{th}$ multi-element code $C_{i,j}$ in the $i^{th}$ group is $c_{i,j}^0, c_{i,j}^1, \ldots, c_{i,j}^{p-1}$;

$d_{i,t}$ is a $t^{th}$ bit of the binary bit sequence $d_{i,0}, d_{i,1}, \ldots, d_{i,pK_1-1}$ corresponding to the $i^{th}$ group of multi-element codes $C_{i,0}, C_{i,1}, \ldots, C_{i,K_1-1}$, and t is an index number, and is valued to be 0 or a positive integer smaller than $pK_1$;

$e_{i,r}$ is an $r^{th}$ bit of the binary bit sequence $e_{i,0}, e_{i,1}, \ldots, e_{i,pK_1-1}$ output after cyclic interleaving of the binary bit sequence of the $i^{th}$ group, and r is an index number, and is valued to be 0 or a positive integer smaller than $pK_1$; and k is 0 or a positive integer smaller than $K_2$.

19. A non-transitory tangible computer storage medium having computer-executable instructions stored therein, the computer-executable instructions being configured to execute a multi-element code modulation mapping method, wherein the method comprises:

performing multi-element domain coding on a first sequence comprising K multi-element codes to obtain a second sequence comprising N multi-element codes;

calculating $K_1$ and $K_2$ according to a multi-element domain element number q and a modulation order M, wherein $K_1 * \log_2 q = K_2 * \log_2 M$, $K_1$ and $K_2$ are both integers not smaller than 2, and q and M are both power of 2;

dividing the second sequence into z groups of multi-element codes with each group comprising $K_1$ multi-element codes, wherein $z=\lceil N/K_1 \rceil$, and $\lceil \; \rceil$ represents rounding up;

mapping each group of multi-element codes to a constellation diagram to form $K_2$ Mth-order modulation symbols, wherein each group of multi-element codes is mapped to at least two Mth-order modulation symbols; and sequentially cascading z groups of Mth-order modulation symbols to form a modulation symbol to be sent.

* * * * *